US011815995B1

(12) United States Patent
Liang et al.

(10) Patent No.: US 11,815,995 B1
(45) Date of Patent: Nov. 14, 2023

(54) REDUNDANCY SCHEMES FOR REPAIRING COLUMN DEFECTS

(71) Applicant: MACRONIX INTERNATIONAL CO., LTD., Hsinchu (TW)

(72) Inventors: Che-Wei Liang, Hsinchu (TW); Shuo-Nan Hung, Hsinchu (TW); Hung-Wei Lu, Taichung (TW); Ming-Cheng Tu, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 77 days.

(21) Appl. No.: 17/730,633

(22) Filed: Apr. 27, 2022

(51) Int. Cl.
  *G06F 11/00* (2006.01)
  *G06F 11/10* (2006.01)
  (Continued)

(52) U.S. Cl.
  CPC ...... *G06F 11/1064* (2013.01); *G06F 11/1666* (2013.01); *G06F 11/2017* (2013.01);
  (Continued)

(58) Field of Classification Search
  CPC ............. G06F 11/1064; G06F 11/1076; G06F 11/1088; G06F 11/1092; G06F 11/1666; G06F 11/2017; G06F 11/2023; G06F 11/2033; G06F 11/2041; G06F 11/2043; G06F 11/2048; G06F 11/2053; G06F 11/2056; G06F 12/0806; G06F 2212/62; G11C 29/04; G11C 29/0401; G11C 29/24; G11C 29/26
  See application file for complete search history.

(56) References Cited

U.S. PATENT DOCUMENTS 5,126,973 A * 6/1992 Gallia .................. G11C 29/808
  365/230.06
5,537,665 A * 7/1996 Patel ..................... G11C 29/76
  714/5.1
(Continued)

OTHER PUBLICATIONS

Ilyoung Kim, Y. Zorian, G. Komoriya, H. Pham, F. P. Higgins and J. L. Lewandowski, "Built in self repair for embedded high density SRAM," Proceedings International Test Conference 1998 (IEEE Cat. No. 98CH36270), Washington, DC, USA, 1998, pp. 1112-1119, doi: 10.1109/TEST.1998.743312. (Year: 1998).*

*Primary Examiner* — Anthony J Amoroso
(74) *Attorney, Agent, or Firm* — Andrew L. Dunlap; Haynes Beffel & Wolfeld LLP

(57) ABSTRACT

A memory device is provided that includes a memory array including a first array, a first redundant array that is local to the first array, a second array, and a second redundant array that is local to the second array, a cache array including a first cache, a first redundant cache that is local to the first cache, a second cache and a second redundant cache that is local to the second cache, and circuits comprising logic to execute operations. The operations include, responsive to an identification of a defective column in the first array, performing a local defect write repair and responsive to an identification of another defective column in the first array and a determination that the first redundant array is fully utilized, performing a global defect write repair by transferring data into the second redundant array through the first cache and the second redundant cache.

20 Claims, 12 Drawing Sheets

(51) Int. Cl.
*G06F 12/0806* (2016.01)
*G06F 11/20* (2006.01)
*G11C 29/04* (2006.01)
*G06F 11/16* (2006.01)

(52) U.S. Cl.
CPC .......... *G06F 12/0806* (2013.01); *G11C 29/04* (2013.01); *G06F 2212/62* (2013.01)

(56) References Cited

U.S. PATENT DOCUMENTS

| | | | | |
|---|---|---|---|---|
| 6,084,807 | A * | 7/2000 | Choi | G11C 29/84 365/205 |
| 6,157,584 | A * | 12/2000 | Holst | G11C 7/065 365/205 |
| 6,185,136 | B1 * | 2/2001 | Shirley | G11C 29/832 365/225.7 |
| 6,665,220 | B2 * | 12/2003 | Vlasenko | G11C 15/00 365/49.17 |
| 7,240,237 | B2 | 7/2007 | Delaney | |
| 7,251,173 | B2 * | 7/2007 | Lunde | G11C 29/808 365/230.06 |
| 8,111,578 | B2 * | 2/2012 | Bollu | G11C 8/12 365/230.02 |
| 8,976,604 | B2 * | 3/2015 | Hung | G11C 29/808 365/230.03 |
| 9,627,094 | B2 * | 4/2017 | Yano | G11C 16/3404 |
| 9,773,571 | B2 * | 9/2017 | Lo | G11C 29/78 |
| 9,858,146 | B2 | 1/2018 | Moertl et al. | |
| 9,864,546 | B1 | 1/2018 | Kovishaner | |
| 11,694,762 | B2 * | 7/2023 | Wieduwilt | H03M 13/1105 365/200 |
| 2001/0026481 | A1 * | 10/2001 | Shirley | G11C 29/832 365/233.1 |
| 2006/0080572 | A1 * | 4/2006 | Fong | G11C 29/808 714/6.13 |
| 2021/0096953 | A1 | 4/2021 | Kotzur et al. | |
| 2022/0100622 | A1 * | 3/2022 | Park | G11C 29/44 |

\* cited by examiner

REDUNDANCY SCHEMES FOR REPAIRING COLUMN DEFECTS

BACKGROUND

Field

The technology disclosed relates to repairing column defects caused by bad blocks in memory devices, including flash memory. More specifically, the technology disclosed relates to repairing the column defects by bypassing columns that have defects in favor of healthy columns that are both local and non-local with respect to the columns having the defects.

Description of Related Art

Large-scale memory arrays, including, for example, large-scale NAND flash memory, may not be perfect, with an expected number of columns having defects, such as bad blocks. For example, during mass production of memory chips there might be physical defects or incomplete photo resistance etching that causes failure when using certain portions (e.g., a particular column) of the memory. Column defects can cause issues for users in some situations.

Column defect redundancy repair schemes have been deployed to fabricate extra memory arrays (e.g., additional columns) to act as a repair for any columns that are or become defective. Some of these repair schemes can be implemented in the factory to replace a limited number of column defects with redundant columns using fuse circuits or the like, to reroute accesses from a column having a defect to a healthy column within a set of extra columns built into the device and sometimes outside of the user addressable parts of the memory. However, these conventional schemes can have timing issues, which increase the time required to read and write data and they can also have limitations with respect to the number of healthy columns that are local and/or available to defective columns for replacing the defective columns.

Therefore, it is desirable to provide redundancy schemes that allow for more efficiently reading and writing data and that provide greater flexibility for repairing column defects.

SUMMARY

The present invention provides a memory device that includes a memory array including a first array of storage, a first redundant array of storage that is local to the first array of storage, a second array of storage, and a second redundant array of storage that is local to the second array. The memory device further includes a cache array including a first cache associated with the first array of storage, a first redundant cache that is local to the first cache, a second cache associated with the second array of storage, and a second redundant cache that is local to the second cache, and control circuits comprising logic to execute operations for transferring data into the memory array. The operations can include responsive to an identification of a defective column in the first array of storage, performing a local defect write repair by transferring data into the first redundant array of storage through one of the first cache and the first redundant cache, and responsive to an identification of another defective column in the first array of storage and a determination that the first redundant array of storage is fully utilized, performing a global defect write repair by transferring data into the second redundant array of storage through the first cache and the second redundant cache.

In a further embodiment the local defect write repair can include, responsive to a determination that the first redundant array of storage is not fully utilized and responsive to an identification of yet another defective column in the first array of storage: (i) in a data-in phase, transferring data addressed to the defective column in the first array of storage and data addressed to the yet another defective column in the first array of storage to the first redundant cache, and in a page-write phase, transferring the data addressed to the defective column in the first array of storage and the data addressed to the yet another defective column in the first array of storage from the first redundant cache to the first redundant array of storage that is local to the first cache.

In another embodiment, the local defect write repair can include, responsive to a determination that the first redundant array of storage is not fully utilized: (i) in a data-in phase, transferring data addressed to the defective column in the first array of storage to the first redundant cache, and (ii) in a page-write phase, transferring the data addressed to the defective column in the first array of storage from the first redundant cache to the first redundant array of storage that is local to the first cache.

In an embodiment, the global defect write repair can include, responsive to the determination that the first redundant array of storage is fully utilized: (i) in the data-in phase, transferring data addressed to the other defective column in the first array of storage to the first cache, and (ii) in the page-write phase, transferring the data addressed to the other defective column from the first cache to the second redundant cache, which is not local to the first cache, and transferring the data addressed to the other defective column from the second redundant cache to the second redundant array of storage that is local to the second array of storage and is not local to the first array of storage.

In another embodiment, the transferring of the data addressed to the defective column, as performed by the local defect write repair, can be performed before the transferring of the data addressed to the other defective column, as performed by the global defect write repair.

In a further embodiment, the transferring of (i) the data addressed to the defective column in the first array of storage to the first redundant cache and (ii) the data addressed to the defective column in the first array of storage from the first redundant cache to the first redundant array of storage that is local to the first cache can be performed before the transferring of (i) the data addressed to the other defective column in the first array of storage to the first cache, (ii) the data addressed to the other defective column from the first cache to the second redundant cache, which is not local to the first cache, and (iii) the data addressed to the other defective column from the second redundant cache to the second redundant array of storage that is local to the second array of storage and is not local to the first array of storage.

In another embodiment, the local defect write repair can include, responsive to a determination that the first redundant array of storage is not fully utilized: (i) in a data-in phase, transferring data addressed to the defective column in the first array of storage to the first cache, and (ii) in a page-write phase, transferring the data addressed to the defective column in the first array of storage from the first cache to the first redundant cache that is local to the first cache and transferring the data addressed to the defective column in the first array of storage from the first redundant cache to the first redundant array of storage that is local to the first array of storage.

In an embodiment, the global defect write repair can include, responsive to the determination that the first redundant array of storage is fully utilized: (i) in the data-in phase, transferring the data addressed to the other defective column in the first array of storage to the first cache, and (ii) in the page-write phase, transferring the data addressed to the other defective column in the first array of storage from the first cache to the second redundant cache that is not local to the first cache and transferring the data addressed to the other defective column in the first array of storage from the second redundant cache to the second redundant array of storage that is not local to the first array of storage.

In a further embodiment, the transferring of the data addressed to the defective column, as performed by the local defect write repair, can be performed before the transferring of the data addressed to the other defective column, as performed by the global defect write repair.

In another embodiment, a memory device is provided. The memory device can include a memory array including a first array of storage, a first redundant array of storage that is local to the first array of storage, a second array of storage, and a second redundant array of storage that is local to the second array of storage, a cache array including a first cache associated with the first array of storage, a first redundant cache that is local to the first cache, a second cache associated with the second array of storage, and a second redundant cache that is local to the second cache, and control circuits comprising logic to execute operations for transferring data from the memory array. The operations can include, after a phase of transferring data from the first array of storage to the first cache and responsive to an identification of a defective column in the first array of storage and a determination that the first redundant array of storage is fully utilized, performing a global defect read repair by transferring data from the second redundant array of storage to the second redundant cache, transferring the data from the second redundant cache to the first cache, and transferring the data from the first cache to an input and output data line. The operations can further include, responsive to an identification of another defective column in the first array of storage, performing a local defect read repair by transferring data from the first redundant array of storage through at least one of the first redundant cache and the first cache to an input and output data line.

In an embodiment, the transferring of the data from the second redundant array of storage to the second redundant cache, the first cache and the input and output data line can include transferring the data from the second redundant array of storage to the second redundant cache, then transferring the data from the second redundant cache to the first cache, and then transferring the data from the first cache to the input and output data line.

In a further embodiment, the global defect read repair can include, responsive to the determination that the first redundant array of storage is fully utilized: (i) in a page-read phase, transferring data addressed to the defective column in the first array of storage from the second redundant array of storage to the second redundant cache and transferring the data addressed to the defective column in the first array of storage from the second redundant cache to the first cache, and (ii)in a data-out phase, and transferring the data addressed to the defective column in the first array of storage from the first cache to a data input and output line.

In another embodiment, the local defect read repair can include: (i) in the page-read phase, transferring data addressed to the other defective column in the first array of storage from the first redundant array of storage to the first redundant cache that is local to the first cache, and (ii) in the data-out phase, transferring the data addressed to the other defective column in the first array of storage from the first redundant cache to a data input and output line.

In an embodiment, the transferring of the data addressed to the defective column in the first array of storage from the second redundant cache to the first cache, as performed in the page-read phase of the global defect read repair, can be performed before the transferring of the data addressed to the other defective column in the first array of storage from the first redundant cache to the data input and output line.

In a further embodiment, the local defect read repair can include: (i) in the page-read phase, transferring data addressed to the other defective column in the first array of storage from the first redundant array of storage to the first redundant cache that is local to the first cache and transferring the data addressed to the other defective column in the first array of storage from the first redundant cache to the first cache, and (ii) in the data-out phase, transferring the data addressed to the other defective column in the first array of storage from the first cache to a data input and output line.

In another embodiment, the transferring of the data addressed to the defective column in the first array of storage from the second redundant cache to the first cache, as performed in the page-read phase of the global defect read repair, can be performed before the transferring of the data addressed to the other defective column in the first array of storage from the first redundant cache to the first cache, as performed in the data-out page-read phase of the local defect repair.

In an embodiment, the local defect read repair can include: (i) in the page-read phase, transferring data addressed to the other defective column in the first array of storage from the first redundant array of storage to the first redundant cache that is local to the first cache and transferring the data addressed to the other defective column in the first array of storage from the first redundant cache to the first cache, and (ii) in the data-out phase, transferring the data addressed to the other defective column in the first array of storage from the first cache to a data input and output line.

In a further embodiment, the transferring of the data addressed to the defective column in the first array of storage from the second redundant cache to the first cache, as performed in the page-read phase of the global defect read repair, can be performed before the transferring of the data addressed to the other defective column in the first array of storage from the first redundant cache to the first cache, as performed in the page-read phase of the local defect repair.

In an embodiment method of writing data to a memory device having a defect is provided, wherein the memory device can include: a memory array including a first array of storage, a first redundant array of storage that is local to the first array of storage, a second array of storage, and a second redundant array of storage that is local to the second array, and a cache array including a first cache associated with the first array of storage, a first redundant cache that is local to the first cache, a second cache associated with the second array of storage, and a second redundant cache that is local to the second cache. The method can include responsive to an identification of a defective column in the first array of storage, performing a local defect write repair by transferring data into the first redundant array of storage through one of the first cache and the first redundant cache, and responsive to an identification of another defective column in the first array of storage and a determination that the first redundant array of storage is fully utilized, performing a global defect write repair by transferring data into the second redundant array of storage through the first cache and the second redundant cache.

In another embodiment, the transferring of the data into the second redundant array of storage through the first cache and the second redundant cache can include transferring the data to the first cache, then transferring the data from the first cache to the second redundant cache and then transferring the data from the second redundant cache to the second redundant array of storage.

In an embodiment, method of reading data from a memory device having a defect is provided, wherein the memory device can include: a memory array including a first array of storage, a first redundant array of storage of storage that is local to the first array of storage, a second array of storage, and a second redundant array of storage that is local to the second array of storage, and an cache array including a first cache associated with the first array of storage, a first redundant cache that is local to the first cache, a second cache associated with the second array of storage, and a second redundant cache that is local to the second cache. The method can include, after a phase of transferring data from the first array of storage to the first cache: responsive to an identification of a defective column in the first array of storage and a determination that the first redundant array of storage is fully utilized, performing a global defect read repair by transferring data from the second redundant array of storage to the second redundant cache, transferring the data from the second redundant cache to the first cache, and transferring the data from the first cache to an input and output data line, and responsive to an identification of another defective column in the first array of storage, performing a local defect read repair by transferring data from the first redundant array of storage through at least one of the first redundant cache and the first cache to an input and output data line.

In a further embodiment, the transferring of the data from the second redundant array of storage to the second redundant cache, the first cache and the input and output data line can include transferring the data from the second redundant array of storage to the second redundant cache, then transferring the data from the second redundant cache to the first cache, and then transferring the data from the first cache to the input and output data line.

Other aspects and advantages of the present invention can be seen on review of the drawings, the detailed description and the claims, which follow.

DETAILED DESCRIPTION

A detailed description of embodiments of the present invention is provided with reference to the FIGS. 1-9.

FIGS. 1A-1D provide example diagrams of memory cells for a 3D NAND device which can implement the redundancy schemes for repairing column defects as described herein. The technology disclosed can implement the redundancy schemes for repairing column defects in other types of memory structures including other types of 2D and 3D memory structures, and is not limited in any way to just 3D NAND devices. These examples provided in FIGS. 1A-1D are merely for the purpose of explaining the plane, block, sub-block (page) and column structure of a memory device. A person of ordinary skill in the art would be able to implement the technology disclosed on various other types of memory devices.

Figure 1A:
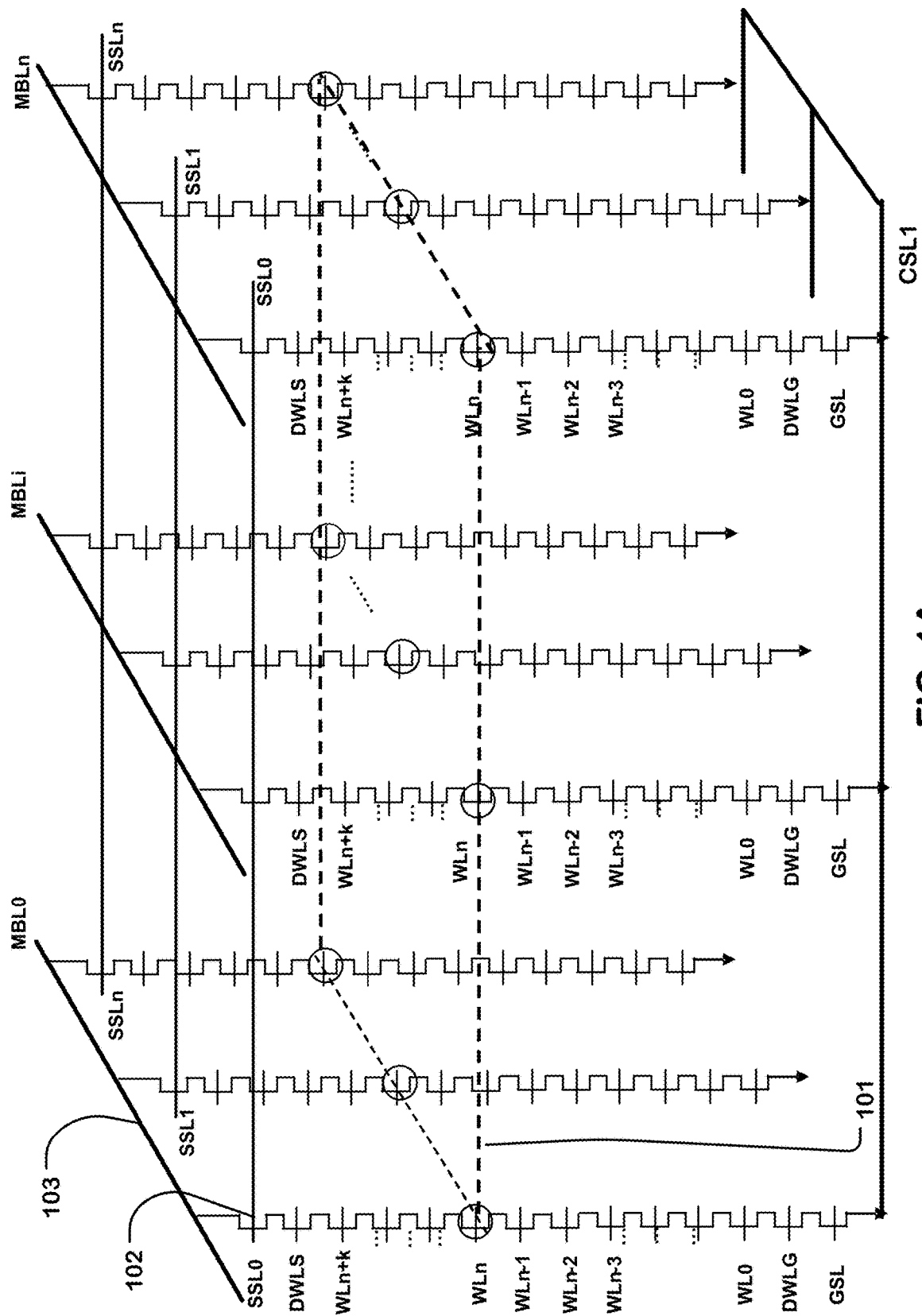
FIG. 1A is a schematic diagram of a block of memory cells in a 3D NAND device which can be used for implementation of redundancy schemes for repairing column defects.

FIG. 1A is a schematic diagram of a block of memory cells in a 3D NAND device which can be used for implementation of redundancy schemes for repairing column defects. The 3D NAND device can comprise many blocks, in which a block includes a plurality of sub-blocks (e.g., pages). In the schematic, a plurality of global bit lines MBL0 to MBLn overlies an array of NAND strings arranged in rows and columns. Each of the NAND strings comprises a series-connected (coupled) string of memory cells, such as dielectric charge trapping memory cells, between a corresponding bit line and a reference line such as the common source line CSL. In some embodiments, the common source line for a block can be implemented as one or more reference lines, and may be coupled to biasing circuitry by which operating voltages are applied in various operations of the memory.

In a 3D NAND arrangement, the set of NAND strings of the block shown in FIG. 1A corresponds with pillars, for example. The NAND strings of the plurality of NAND strings are coupled with a corresponding stack of word lines WL0 to WLn+k, in which each word line is coupled to memory cells at its layer, in all the NAND strings in the block, in this example. At word line WLn, the planar structure of each of the word line layers is represented by the dashed line 101. Thus, all the memory cells in the block at the level of a given word line, such as WLn, in the block are coupled to that given word line, such as WLn, so that they can be activated by voltages applied to the given word line.

Also, each of the NAND strings includes a corresponding sub-block string select gate (e.g., 102) configured to connect (couple) the NAND string to a particular bit line (e.g., 103) in the plurality of bit lines.

A plurality of sub-block string select lines SSL0 to SSLn are operatively coupled to the string select gates of respective distinct subsets of NAND strings, where each subset of NAND strings includes a sub-block of the block of memory cells, to apply gate voltages to the sub-block string select gates.

Also, each of the NAND strings includes a corresponding lower select gate configured to connect (couple) the NAND string to the common source line or one of the one or more reference lines used to implement the common source line. A lower select gate layer GSL is coupled to all the lower select gates for the NAND strings in the block in this example. In another example, there can be a plurality of lower select gate lines arranged for connection (coupling) to the lower select gates in the block.

In this example, a lower dummy word line DWLG lies between the lower select gate layer GSL and the lowest word line layer WL0, and an upper dummy word layer DWLS lies between the string select lines SSL0 to SSLn and the uppermost word line layer WLn+k.

In the circuit of FIG. 1A, in order to select a particular memory cell in the block, a sub-block is activated by a sub-block string select line which connects (couples) each NAND string in the selected sub-block to a respective bit line in the plurality of bit lines, and a word line layer is selected which selects one memory cell at the level of the selected word line on each NAND string in the selected sub-block. The selected memory cell is activated by selecting one bit line corresponding to the NAND string in which the selected memory cell is located. This arrangement enables activation of a plurality of memory cells in parallel, one in each of the NAND strings of the selected sub-block, via its corresponding bit line and word line layer.

"Activate", as used herein, means to apply a particular bias so as to give effect to the connected (coupled) cells or switches. The bias may be high or low, depending on the operation and the memory design. For the purposes of this description, the term "charging" refers to both driving the node to a higher voltage and driving the node to a lower voltage, including ground and negative voltages in some embodiments.

A NAND block as described herein can be implemented using a 3D NAND memory technology. Implementations can also be made using 2D NAND technology, in which the NAND block is logically defined across the plurality of 2D NAND arrays.

Figure 1B:
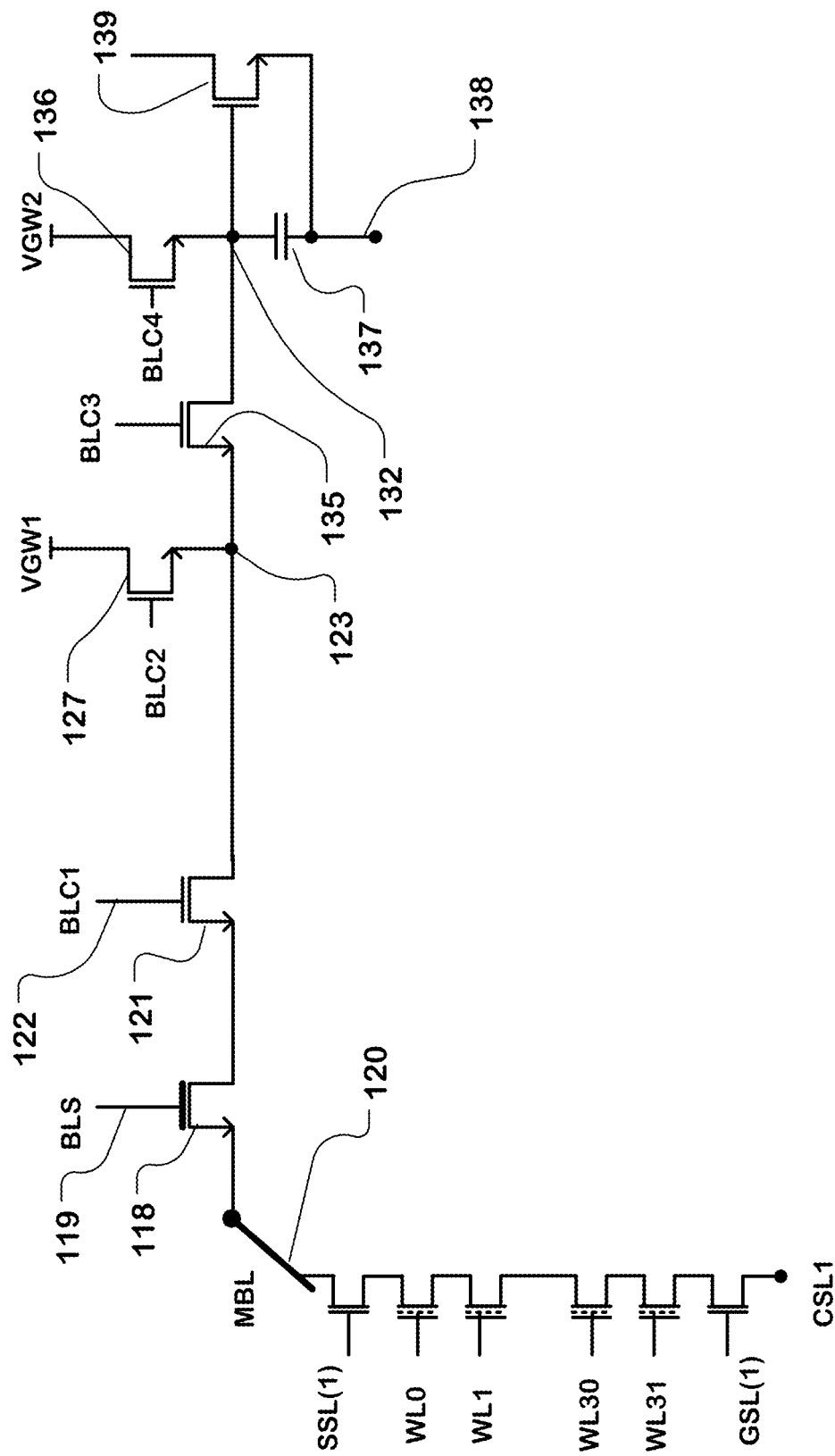
FIG. 1B illustrates the structure of a sense amplifier and bit line bias circuit which can be used to apply bias voltages to each bit line in the plurality of bit lines.

FIG. 1B illustrates the structure of a sense amplifier and bit line bias circuit which can be used to apply bias voltages to each bit line in the plurality of bit lines. A page buffer can include one sense amplifier and bit line bias circuit each bit line coupled to a selected block of the array.

The circuit in FIG. 1B is connected (coupled) to a global bit line or master bit line (GBL or MBL) 120. A bit line select transistor 118 has a first source/drain terminal connected (coupled) to the global bit line 120 and a second source/drain terminal. A gate of the bit line select transistor 118 is connected (coupled) to a control signal BLS on line 119. A bit line clamp transistor 121 has a first source/drain terminal connected (coupled) to the second source/drain terminal of transistor 118, and a second source/drain terminal connected (coupled) to connecting (coupling) node 123. The bit line clamp transistor 121 has its gate connected (coupled) to the BLC1 line 122 at which bias voltages are applied by circuits not shown to control the voltage level of the GBL 120 during precharge operations and other operations. A transistor 127 is provided for connecting (coupling) node 123 to BLC2 line at which bias voltages are applied by circuits not shown. A pass transistor 135 is connected (coupled) between connecting (coupling) node 123 and a sensing node 132.

The pass transistor 135 is controlled by a control signal BLC3, which controls connection and disconnection of the connecting (coupling) node 123 to the sensing node 132. A transistor 136 is connected (coupled) between the sensing node 132 and a bias voltage VGW2, and is controlled by signal BLC4. A capacitor 137 (capacitance) is coupled from sensing node 132 to a sense signal node 138. A sensing transistor 139 has a gate connected (coupled) to the sensing node 132, a first current carrying terminal connected (coupled) to the sense pulse node 138 and a second current carrying terminal providing a sense amplifier output, which can be connected (coupled) to latches of a page buffer. During read operations and other operations, the transistors 118, 127 and 121 can be operated to set a bias voltage level on the selected bit lines as suits a particular operation.

Figure 1C:
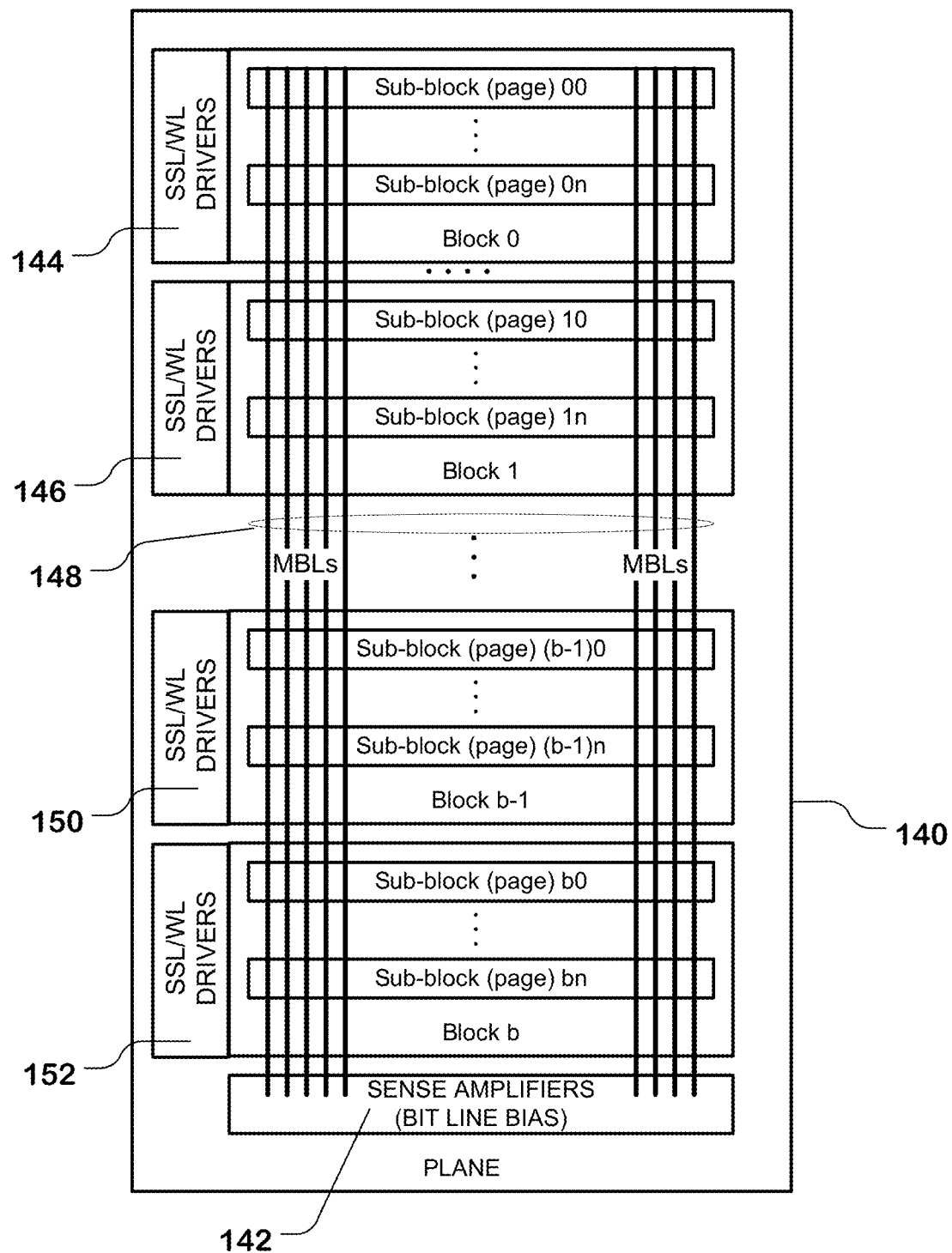
FIG. 1C illustrates segmentation of a memory array on a memory device on a plane, block and sub-block (e.g., page) levels according to one example to which the technology described herein can be applied.
Figure 1D:
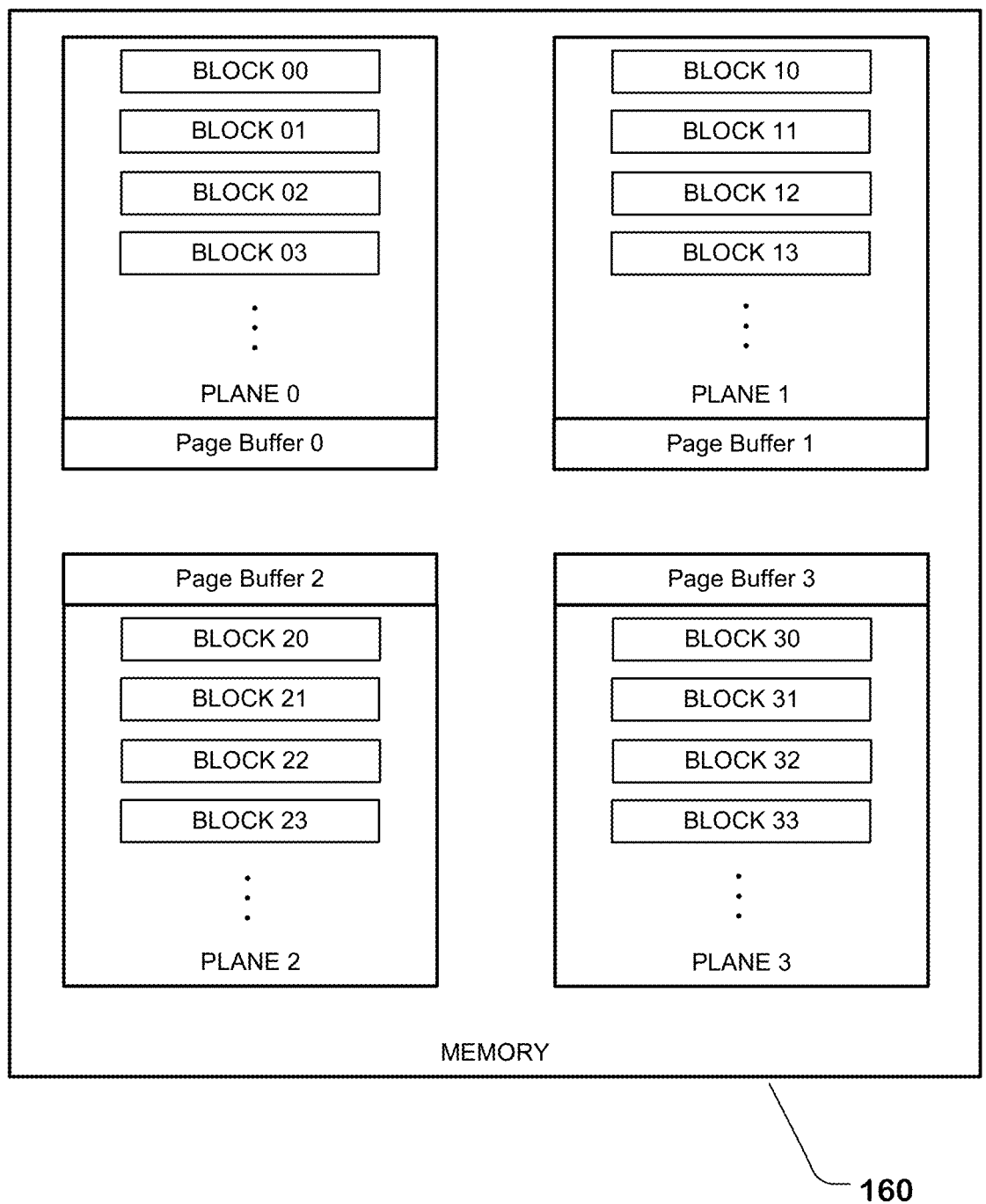
FIG. 1D illustrates segmentation of a memory array on a memory device on plane and block levels according to an example to which the technology described herein can be applied.

FIGS. 1C and 1D illustrate a segmentation of a memory array on a memory device on a plane, block and sub-block (e.g., page) levels according to one example to which the technology described herein can be applied. The technology described includes implementing redundancy schemes to repair column defects during read and write operations.

FIG. 1C illustrates a configuration of a single plane 140 in a memory array. The plane 140 includes a plurality of blocks, Block 0, Block 1, . . . Block (b−1) and Block(b). Each of the blocks includes a plurality of sub-blocks. The sub-blocks can be referred to as pages. Pages, or sub-blocks, can be, for example, 512, 2,048 or 4,096 bytes in size. Block 0 includes sub-block 00 to sub-block 0n, block 1 includes sub-block 10 to sub-block 1n, Block (b−1) includes sub-block (b−1)0 two sub-block (b−1)n and Block b includes sub-block (b)0 two sub-block (b)n.

A plurality of global (master) bit lines 148 (MBLs) superimposes, and is shared by, all of the blocks in the plane. A set of sense amplifiers and bit line bias circuits can be part of page buffer circuits, and is coupled to the plurality of global bit lines 148, by which bias voltages can be applied to the global bit lines 148. The set of sense amplifiers and bit line bias circuits 142 is shared by all of the blocks in the plane. Each of the blocks includes corresponding string select line SSL and word line WL drivers 144, 146, 150, 152, by which bias voltages can be applied in support of the read or write operations. Also, a common source line driver can be applied to each of the blocks. One or more caches can be provided to store data to be written to or read from the memory array.

FIG. 1D illustrates a memory 160 including multiple planes, Plane 0, Plane 1, Plane 2 and Plane 3, in this example. Each of the planes includes distinct page buffer circuits, including Page Buffer 0, Page Buffer 1, Page Buffer 2, Page Buffer 3. The Page Buffers are coupled to input/output circuitry not shown, supporting high throughput memory operations on the multiple planes. As illustrated, each of the planes includes a plurality of blocks. Plane 0 includes Block 00, Block 01, Block 02, Block 03, . . . . Plane 1 includes Block 10, Block 11, Block 12, Block 13, . . . .

Plane 2 includes Block 20, Block 21, Block 22, Block 23, . . . . Plane 3 includes Block 30, Block 31, Block 32, Block 33, . . . , .

Figure 2:
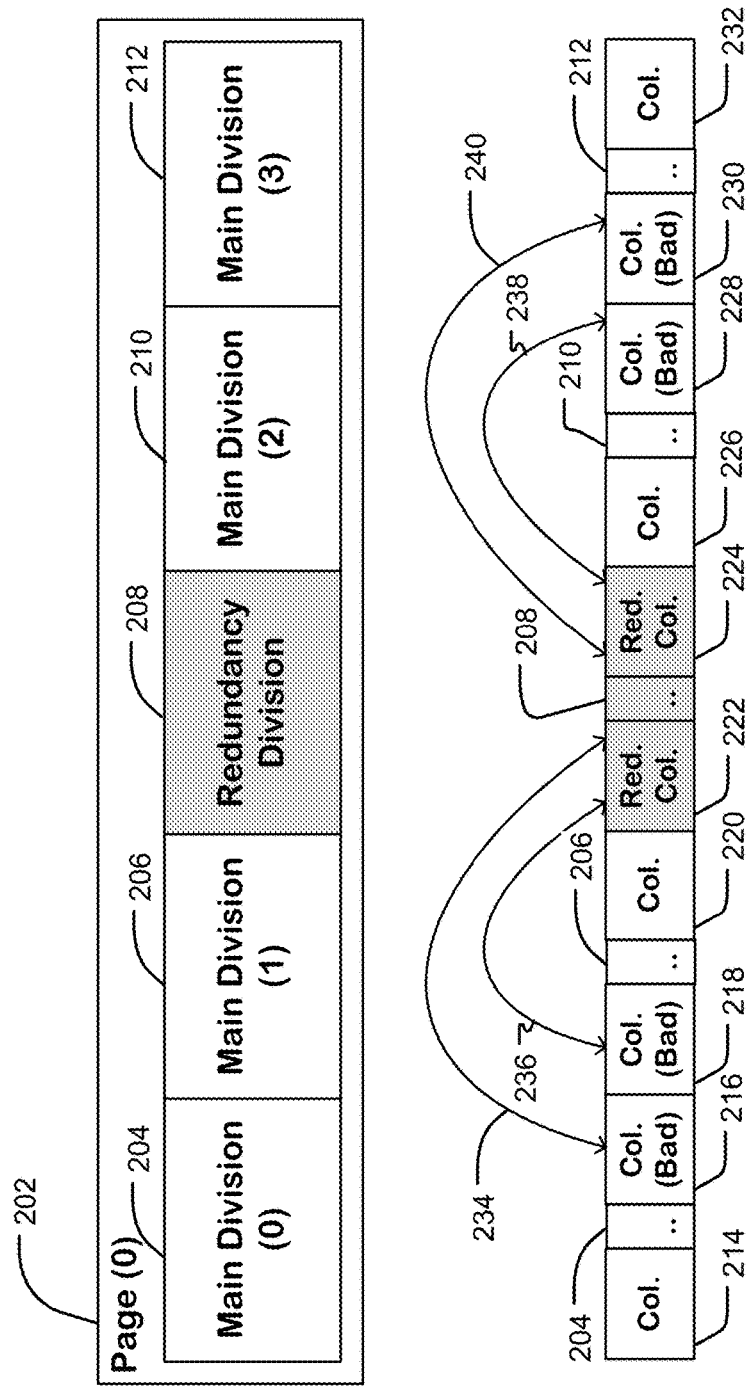
FIG. 2 illustrates a conventional type of redundancy scheme that can be implemented to repair column defects in a memory array.

FIG. 2 illustrates a conventional type of redundancy scheme 200 that can be implemented to repair column defects in a memory array.

As illustrated, page (0) 202 of a memory array can include multiple divisions and a redundancy division for read and write operations. Specifically, page (0) 202 can include main division (0) 204, main division (1) 206, redundancy division 208, main division (2) 210 and main division (3) 212. The sizes of the main divisions 204, 206, 210 and 212 and the size of the redundancy division 208 can be dictated by the designer of the memory array.

FIG. 2 further illustrates that main division (0) 204 can include many columns for storing data, such as cols. 214 and 216. The number of columns will be much greater in an actual memory array. In this example, col. 216 is a defective or bad column, meaning that it cannot be reliably used for storing data. Further, in this example, main division (1) 206 includes cols. 218 and 220, wherein col. 218 is a defective column. Main division (2) 210 includes cols. 226 and 228, wherein col. 228 is a defective column. Main division (3) 212 includes cols. 230 and 232, wherein col. 230 is a defective column. The redundancy division 208 can include many columns, including cols. 222 and 224. The size of the redundancy division 208 can be set by the designer of the memory array. It is beneficial to have a redundancy division 208 that is large enough to provide enough redundancy in anticipation of how many defective columns there could be during the lifespan of the memory array. However, having too large of a redundancy division 208 takes away from the overall storage capacity of the memory array.

As also illustrated in FIG. 2, the conventional redundancy scheme can use redundancy cols. 222 and 224 to essentially replace defective cols. 216, 218, 228 and 230. Redundancy cols. 222 and 224 can actually represent more than two columns, as cols. 222 and 224 are provided merely for illustrative purposes. In other words, redundancy col. 222 can actually include multiple columns and redundancy col. 224 can also include multiple columns, so as to be able to provide redundancy for each of defective cols. 216, 218, 228 and 230. For example, data addressed to col. 216 during a write operation can be stored in redundancy col. 222. Arrows 234, 236, 238 and 240 illustrate that redundancy division 208 is used to repair defective cols. 216, 218, 228 and 230 of main divisions 204, 206, 210 and 212. The repairing of the defective cols. 216, 218, 228 and 230 is more complex that what is illustrated, as for example, various cache arrays and lookup tables can be implemented to route data to and from the various columns, so that data addressed to or from an address directed to a defective column is read from or written to redundancy columns having different addresses.

This conventional redundancy scheme illustrated in FIG. 2 can be inefficient because the redundancy division 208 can be used to repair any bad column without limitation. The repairs are not done simultaneously, so first redundancy data is transferred to a main division having a defective column from the redundancy division at a read-end operation during busy, in advance of a data-out operation. The time taken for this operation can be $TIME_{REDUNDANCY-TO-MAIN}$. Redundancy data is also transferred from the main division having the defective column to the redundancy division. The time taken for this (repairing) operation can be referred to as $TIME_{MAIN-TO-REDUNDANCY}$. Assuming that a page has M redundancy columns (e.g., M=100), the total repair time will be $M \times TIME_{REDUNDANCY-TO-MAIN}$ or $M \times TIME_{MAIN-TO-REDUNDANCY}$ (depending on the type of operation), because none of the repairs are performed simultaneously.

Figure 3:
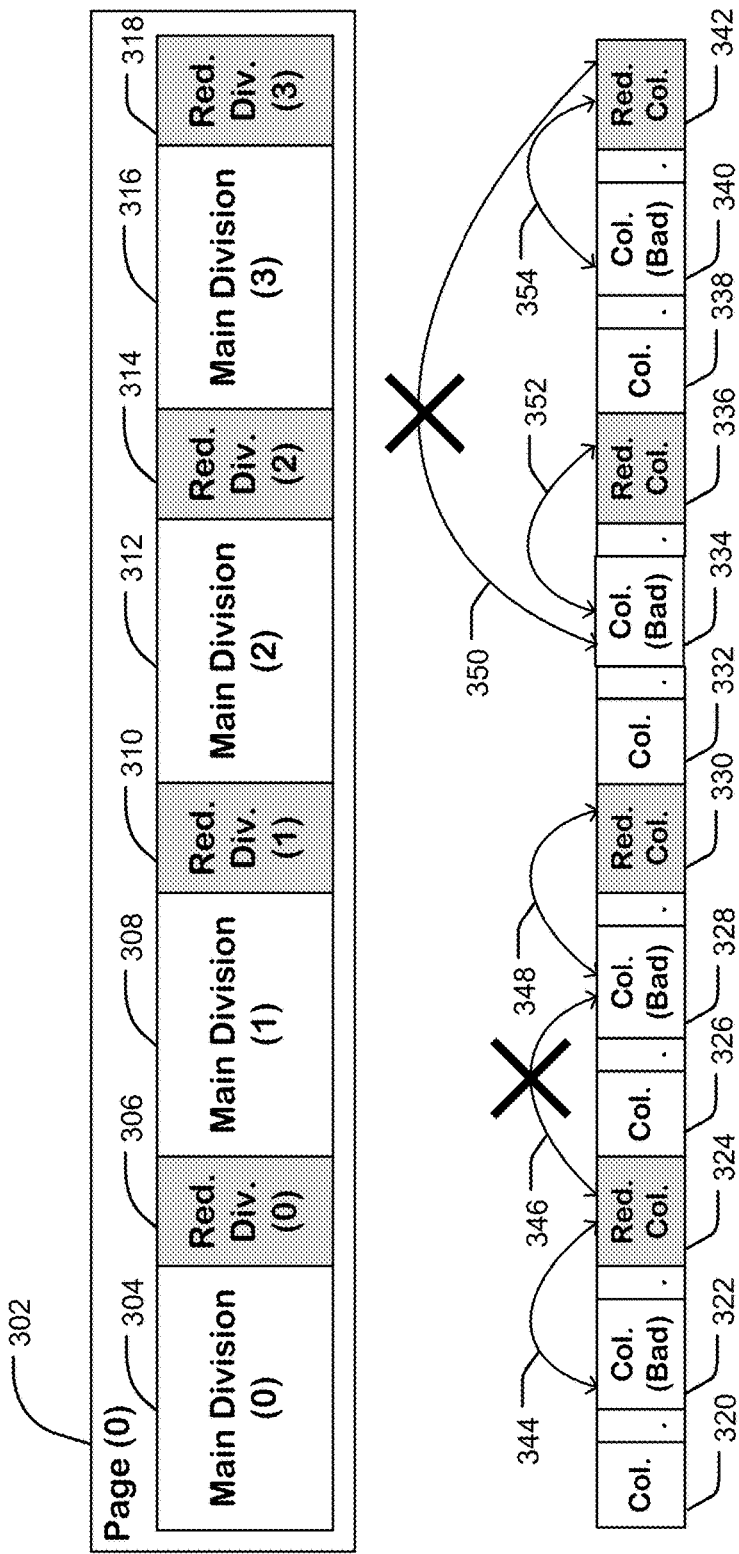
FIG. 3 illustrates another conventional type of redundancy scheme that can be implemented to repair column defects in a memory array.

FIG. 3 illustrates another conventional type of redundancy scheme 300 that can be implemented to repair column defects in a memory array.

Similar to FIG. 2, FIG. 3 illustrates page (0) 302, main division (0) 304, main division (1) 308, main division (2) 312 and main division (3) 316. Here, each main division 304, 308, 312 and 316 has a corresponding "local" redundancy division (i.e., redundancy division (0) 306, redundancy division (1) 310, redundancy division (2) 314 and redundancy division (3) 318). In this example, redundancy division (0) 306 is "local" to main division (0) 304, redundancy division (1) 310 is "local" to main division (1) 308, redundancy division (2) 314 is "local" to main division (2) 312, and redundancy division (3) 318 is "local" to main division (3) 316. The term "local" can mean that a certain redundancy division is assigned to a particular main division.

As illustrated in FIG. 3, main division (0) 304 includes col. 320 and defective col. 322, redundancy division (0) 306 includes redundancy col. 324, main division (1) 308 includes col. 326 and defective col. 328, redundancy division (1) 310 includes redundancy col. 330, main division (2) 312 includes col. 332 and defective col. 334, redundancy division (2) 314 includes redundancy col. 336, main division (3) 316 includes col. 338 and defective col. 340 and redundancy division (3) 318 includes redundancy col. 342. As further illustrated by line 344, redundancy col. 324 can be used to repair defective col. 322 because redundancy division (0) 306 is "local" to main division (0) 304 which includes defective col. 322. However, as illustrated by line 346, redundancy col. 324 of redundancy division (0) 306 cannot be used to repair defective col. 328 of main division (1) 308 because redundancy division (0) 306, which includes redundancy col. 324, is not "local" to main division (1) 308. Similarly, as illustrated by line 348, redundancy col. 330 of redundancy division (1) can be used to repair defective col. 328 because redundancy division (1) 310 is "local" to main division (1) 308. As illustrated by line 350, redundancy col. 342 cannot be used to repair defective col. 334 of main division (2) 312 because redundancy division (3) 318 is not "local" to main division (2) 312. Line 352 illustrates that redundancy col. 336 can be used to repair defective col. 334 of main division (2) 312, because main division (2) 312 is "local" to redundancy division (2) 314, which includes redundancy col. 336. Line 354 illustrates that redundancy col. 342 can be used to repair defective col. 340 of main division (3) 316, because main division (3) 316 is "local" to redundancy division (3) 318, which includes redundancy col. 342.

This redundancy scheme illustrated in FIG. 3 can improve repair time, when compared to the redundancy scheme of FIG. 2, because only "local" repairs are permitted and because repairs for each redundancy division can be performed simultaneously. For example, the total repair time could be (M/N)×TIME, where, as mentioned above, M represents the total number of redundancy columns and where N represents the number of redundancy divisions. Further, for example, assume there are 100 total redundancy columns in page (0) 302 (e.g., M=100) and there are 4 redundancy divisions (e.g., redundancy division (0) 306, redundancy division (1) 310, redundancy division (2) 314 and redundancy division (3) 318, such that N=4). Therefore the total repair time could be (100/4)×TIME. However, by having repairs limited to redundancy divisional that are "local," a problem will arise when the "local" redundancy division can become full, thus limiting the number of defective columns that can be repaired.

Figure 4:
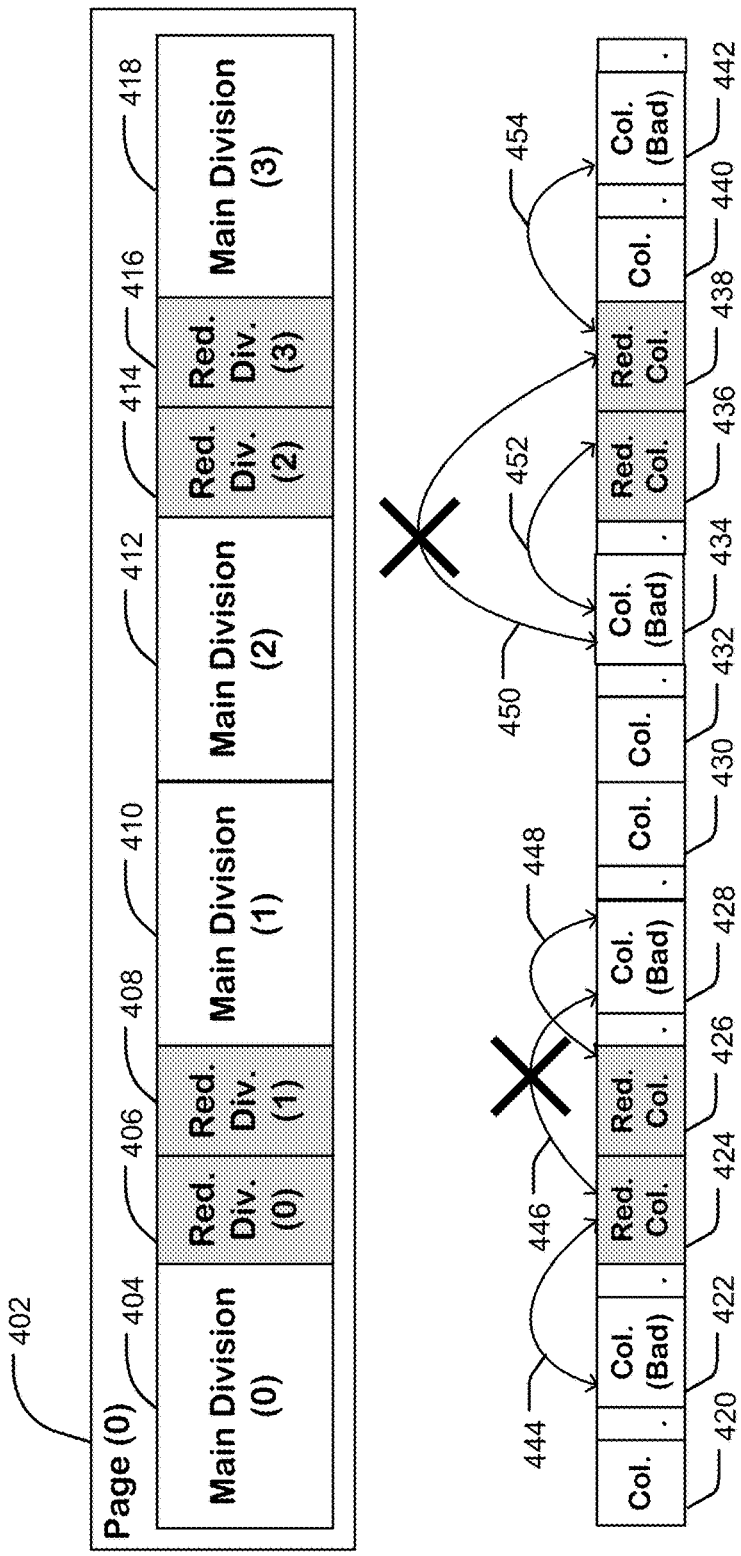
FIG. 4 illustrates a different redundancy structure that implements the same "local" redundancy scheme as illustrated and discussed above with reference to FIG. 3.

FIG. 4 illustrates a different redundancy structure 400 that implements the same "local" redundancy scheme as illustrated and discussed above with reference to FIG. 3.

Specifically, FIG. 4 illustrates page (0) 402 of a memory array, wherein page (0) 402 includes main division (0) 404, redundancy division (0) 406, redundancy division (1) 408, main division (1) 410, main division (2) 412, redundancy division (2) 414, redundancy division (3) 416 and main division (3) 418. Here, main division (0) 404 includes col. 420 and defective col. 422, redundancy division (0) 406 includes redundancy col. 424, redundancy division (1) 408 includes redundancy col. 426, main division (1) 410 includes defective col. 428 and col. 430, main division (2) 412 includes col. 432 and defective col. 434, redundancy division (2) 414 includes redundancy col. 436, redundancy division (3) 416 includes redundancy col. 438 and main division (3) 418 includes col. 440 and defective col. 442.

Redundancy division (0) 406 is "local" to main division (0) 404, redundancy division (1) 408 is "local" to main division (1) 410, redundancy division (2) 414 is "local" to main division (2) 412 and redundancy division (3) 416 is "local" to main division (3) 418. Other methods of designating "local" redundancy divisions to main divisions can also be implemented.

Similarly to FIG. 3, line 444 indicates that redundancy col. 424 can be used to repair defective col. 422 and line 446 indicates that redundancy col. 424 cannot be used to repair non-local defective col. 428. Line 448 indicates that redundancy col. 426 can be used to repair defective col. 428. Line 450 indicates that redundancy col. 438 cannot be used to repair non-local defective col. 434. Line 452 indicates that defective col. 434 can be repaired using "local" redundancy col. 436. Line 454 indicates that defective col. 442 can be repaired using "local" redundancy col. 438.

The scheme illustrated in FIG. 4 can be improved upon by allowing a division to be repaired by a redundancy division of a neighboring division. For example, if (i) main division (0) 404 does not have a defective column, (ii) main division (1) 410 does include two defective columns, (iii) redundancy division (1) 408 only includes one (available) redundancy column, then redundancy col. 424 can be used for repairing main division (1) 410. In other words, in this situation (where line 444 does not exist because main division (0) 404 does not have a defective column), line 446 is acceptable to repair col. 428 using redundancy col. 424. Redundancy division (0) 406 can be used to repair main division (1) 410 in this improved scheme because main division (1) 410 is a neighbor to main division (0) 404. Main divisions cannot be repaired using redundancy divisions of non-neighboring main divisions.

Figure 5:
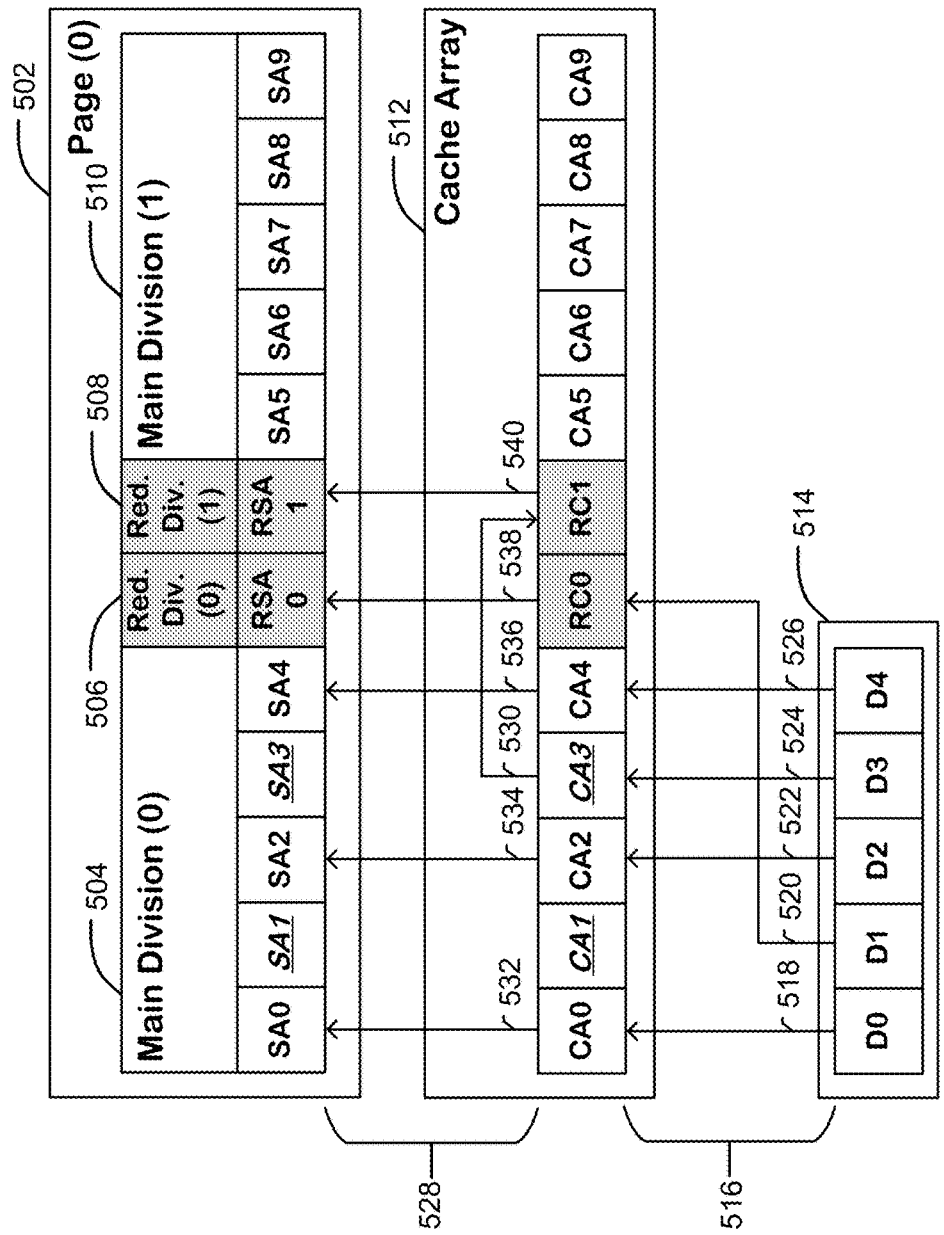
FIG. 5 illustrates a hybrid redundancy scheme for performing write operations.

FIG. 5 illustrates a hybrid redundancy scheme 500 for performing write operations.

Specifically, FIG. 5 illustrates that a memory array includes a main division (0) 504 (e.g., a first array of storage), a redundancy division (0) 506 (e.g., a first redundant array of storage), a redundancy division (1) 508 (e.g., a second redundant array of storage) and main division (1) 510 (e.g., a second array of storage). The locations of the main division (0) 504, the redundancy division (0) 506, the redundancy division (1) 508 and the main division (1) 510 are for illustrative purposes only. These locations can be configured differently, such as that illustrated in FIG. 3 or in some other configuration. FIG. 5 illustrates that the main division (0) 504 includes sense amplifiers SA0, SA1, SA2, SA3 and SA4, that the redundancy division (0) 506 includes redundancy sense amplifier RSA0, that redundancy division (1) 508 includes redundancy sense amplifier RSA1 and that main division (1) 510 includes sense amplifiers SA5, SA6, SA7, SA8 and SA9. Redundancy division (0) 506 can be considered as being "local" to main division (0) 504 and redundancy division (1) 508 can be considered as being "local" to main division (1) 510. In the same regard, redundancy division (1) 508 can be considered "global" with respect to main division (0) 504 and redundancy division (0) 506 can be considered "global" with respect to main division (1) 510.

Sense amplifiers SA0, SA1, SA2, SA3, SA4, SA5, SA6, SA7, SA8 and SA9 and redundancy sense amplifiers RSA0 and RSA1 can represent different columns of memory that are part of the main division (0) 504, the redundancy division (0) 506, the redundancy division (1) 508 and the main division (1) 510. For the sake of simplicity, as discussed below, when referring to writing data to or reading data from sense amplifiers sense amplifiers SA0, SA1, SA2, SA3, SA4, SA5, SA6, SA7, SA8 and SA9 and redundancy sense amplifiers RSA0 and RSA1, the technology disclosed is describing writing data to or reading data from the various columns connected (coupled) to the sense amplifiers SA0, SA1, SA2, SA3, SA4, SA5, SA6, SA7, SA8 and SA9 and redundancy sense amplifiers RSA0 and RSA1.

Additionally, FIG. 5 illustrates a cache array 512. The cache array 512 can include a first cache, which is a combination of caches CA0, CA1, CA2, CA3 and CA4, that is associated with or corresponds to the main division (0) 504. Being "associated with" or "corresponding to" in this sense means that the first cache is designed to write to and read from sense amplifiers SA0, SA1, SA2, SA3 and SA4 of the main division (0) 504. Additional components can be located between the first cache and the corresponding main division (0) 504. The cache array 512 can also include a first redundant cache RC0 that is "local" to the first cache. The first redundant cache RC0 can be associated with the redundancy sense amplifier RSA0 of the redundancy division (0) 506.

The cache array 512 can also include a second cache, which is a combination of caches CA5, CA6, CA7, CA8 and CA9, that is associated with or corresponds to the main division (1) 510. Being "associated with" or "corresponding to" in this sense means that the second cache is designed to write to and read from sense amplifiers SA5, SA6, SA7, SA8 and SA9 of the main division (1) 510. Additional components can be located between the second cache and the corresponding main division (1) 510. The cache array 512 can also include a second redundant cache RC1 that is "local" to the second cache. The second redundant cache RC1 can be associated with the redundancy sense amplifier RSA1 of the redundancy division (1) 508.

FIG. 5 also illustrates a data input and output interface 514 that includes various data input and output lines (or input and output data lines) D0, D1, D2, D3 and D4. The technology disclosed can include control circuitry, such as that illustrated in FIG. 9 and discussed in further detail below, that includes logic to execute write and read operations for transferring data into the memory array and for transferring data out of the memory array using the data input and output lines D0, D1, D2, D3 and D4.

Specifically, FIG. 5 illustrates a data-in phase 516 of transferring data from the data input and output interface 514 to the cache array 512 and a page-write phase 528 of performing global repairs and transferring data from the cache array 512 to page (0) 502 of the memory array.

In the example illustrated in FIG. 5, sense amplifiers SA1 and SA3 are connected (coupled) to defective columns. SA1 and SA3 are underlined and italicized in FIG. 5 to indicate that they correspond to defective columns. In addition, caches CA1 and CA3 are underlined and italicized in FIG. 5 because they correspond to sense amplifiers SA1 and SA3 and are associated with defective columns.

In the data-in phase 516 local repairs can be performed without the addition of extra time because they are done using an on-the-fly redundant access scheme; then the global repairs can be performed in, for example, the page-write phase 528. This on-the-fly redundant access repair using the "local" cache increases the overall speed of the redundancy scheme. The speed of repairs can be increased because the on-the-fly access scheme does not add any additional time (e.g., operation 520 below does not add any time for the repair). The hybrid redundancy scheme 500 includes performing local defect repair in the data-in phase 516. Since the column associated with sense amplifier SA0 is not defective, in operation 518, data is written from D0 to CA0. The hybrid redundancy scheme 500 also includes identifying the existence of a defective column associated with SA1 and CA1 and then determining whether the redundancy division (0) 506 (e.g., the first redundant array of storage) is available for redundancy repair (e.g., determining whether there is room in a column associated with redundancy sense amplifier RSA0). In other words, a determination is made as to whether the first redundant array of storage is fully utilized. If the first redundant array of storage is not fully utilized, then a local defect repair can be performed by operation 520. Operation 520 transmits data from D1 to redundant cache RC0 (e.g., data that is addressed to the defective column in the first array is transferred to the first redundant cache). Operations 518, 520, 522, 524 and 526 of the data-in phase 516 are performed sequentially. Then after the data-in phase 516, but before page-write operations are performed, the global repairs are performed, as discussed below.

In operation 522 data is written from D2 to CA2, since the column associated with sense amplifier SA2 is not defective.

In operation 524, as a result of (e.g., responsive to) a determination that the column associated with SA3 is defective and also as a result of (e.g., responsive to) a determination that redundant cache RC0 is already utilized (e.g., as utilized by operation 520), data is transmitted (transferred) from D3 to cache CA3. In other words, redundant cache RC0 has been used to receive data from D1, so a global defect repair can be performed using, for example, non-local (global) redundancy division (1) 508, which includes redundancy sense amplifier RSA1 and non-local (global) redundant cache RC1. Specifically, operation 524 includes transmitting data addressed to SA3 to cache CA3 (and eventually to RC1, as discussed below) because redundant cache RC0 has already been utilized by operation 520 and a local repair is not possible. Defect information can be stored in one more tables (or other format) and can indicate addresses of defective columns as well as include addressing information and usage information so as to be able to map input and output lines to caches, redundant caches, sense amplifiers and redundancy sense amplifiers for all of the redundancy schemes described herein.

The data-in phase 516 in this example concludes by performing operation 526, which includes transmitting data, which is addressed to SA4, from D4 to cache CA4 because the column associated with SA4 is not defective.

During a page-write phase 528 that performs global repairs and writes data to the main division (0), the local redundancy division (0) 506 and the global redundancy division (1) 508. Before performing actual page writing operations, global repairs are performed. Specifically, in operation 530 data is transmitted from CA3, which is associated with a defective column, to global redundant cache RC1. Since redundant cache RC0 has been utilized by operation 520 and there are no more available local redundant caches, operation 530 transmits data to a non-local (e.g., global) redundant cache RC1. After the global repair is complete using redundant cache RC1, the page-write operations can be performed.

In operation 532 data is transmitted from cache CA0 to SA0 and then to the corresponding column. Data has not been transferred to CA1 in the data-in phase 516 and the page-write phase 528 does not transmit data from CA1, which is associated with a defective column. In operation 534 data is transmitted from cache CA2 to SA2 and then to the corresponding column. In operation 536 data is transmitted from CA4 to SA4 and then to the corresponding column. In operation 538 the data, which was initially addressed to sense amplifier SA1, is transmitted from local redundant cache RC0 to local redundancy sense amplifier RSA0 to complete the local repair. In operation 540 the data, which was initially addressed to sense amplifier SA3, is transmitted from non-local redundant cache RC1 to non-local redundant sense amplifier RSA1 to complete the global repair. Operation 530 can be performed before operations 532, 534, 536, 538 and 540 and then operations 532, 534, 536, 538 and 540 can be performed simultaneously. If redundancy division (0) 506 is fully utilized (e.g., a local repair cannot be performed), then repairs can be performed globally. For example, if a local repair cannot be performed because redundancy division (0) 506 is fully utilized, then a global repair will be performed using redundancy division (1) 508, or other redundancy divisions that are available. In a similar matter, the repair schemes described below with reference to FIGS. 6-8 can bypass a local repair if the local redundancy division is fully utilized.

Figure 6:
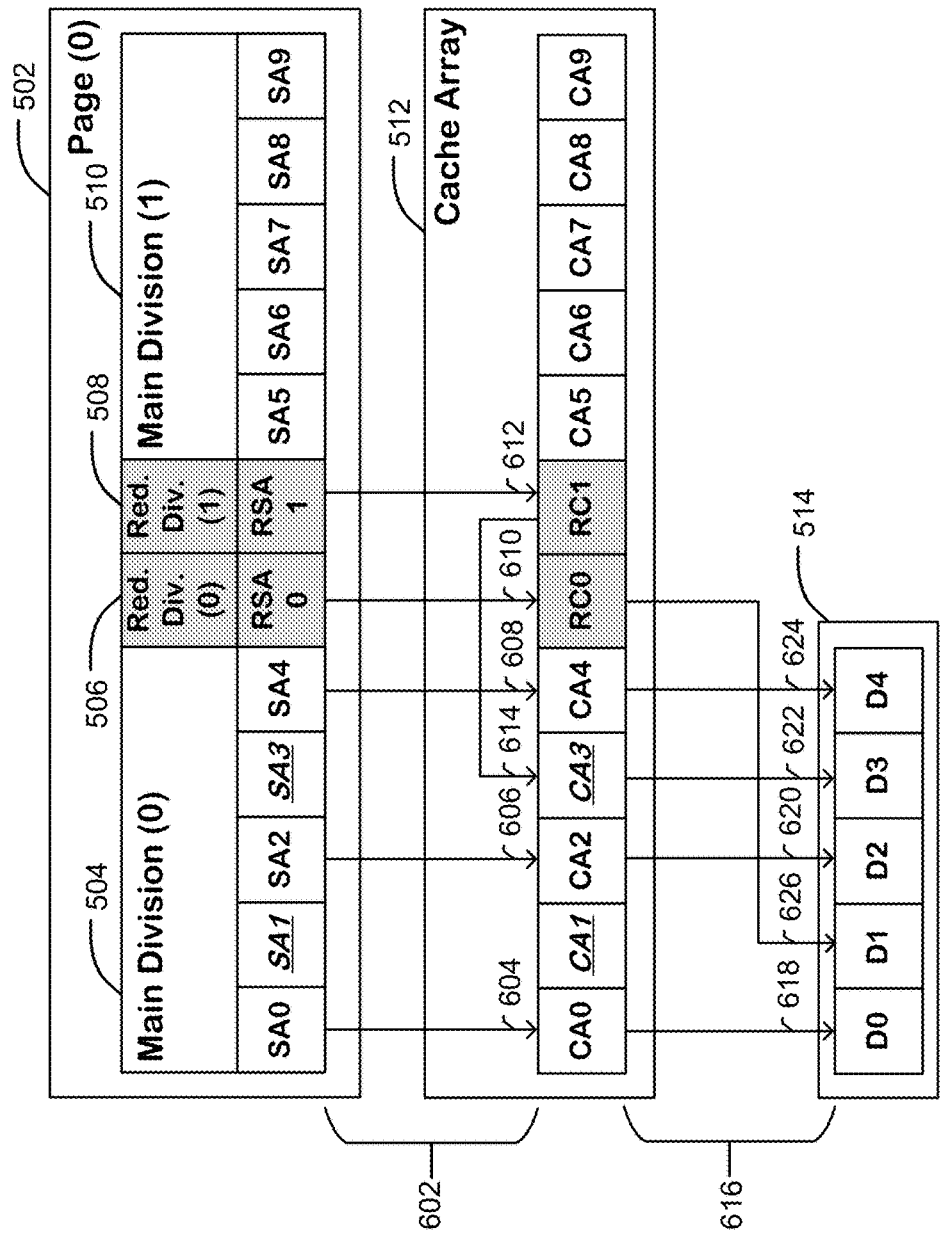
FIG. 6 illustrates a hybrid redundancy scheme for performing read operations.

FIG. 6 illustrates a hybrid redundancy scheme 600 for performing read operations.

Similar to FIG. 5, FIG. 6 illustrates that a memory array includes a main division (0) 504 (e.g., a first array of storage), a redundancy division (0) 506 (e.g., a first redundant array of storage), a redundancy division (1) 508 (e.g., a second redundant array of storage) and main division (2) 510 (e.g., a second array of storage). The locations of the main division (0) 504, the redundancy division (0) 506, the redundancy division (1) 508 and the main division (2) 510 are for illustrative purposes only. These locations can be configured differently, such as that illustrated in FIG. 3 or in some other configuration. FIG. 6 illustrates that the main division (0) 504 includes sense amplifiers SA0, SA1, SA2, SA3 and SA4, that the redundancy division (0) 506 includes redundancy sense amplifier RSA0, that redundancy division (1) 508 includes redundancy sense amplifier RSA1 and that main division (1) 510 includes sense amplifiers SA5, SA6, SA7, SA8 and SA9. Redundancy division (0) 506 can be considered as being "local" to main division (0) 504 and redundancy division (1) 508 can be considered as being "local" to main division (1) 510. In the same regard, redundancy division (1) 508 can be considered "global" with respect to main division (0) 504 and redundancy division (0) 506 can be considered "global" with respect to main division (1) 510.

Sense amplifiers SA0, SA1, SA2, SA3, SA4, SA5, SA6, SA7, SA8 and SA9 and redundancy sense amplifiers RSA0 and RSA1 can represent different columns of memory that are part of the main division (0) 504, the redundancy division (0) 506, the redundancy division (1) 508 and the main division (1) 510. For the sake of simplicity, as discussed below, when referring to writing data to or reading data from sense amplifiers sense amplifiers SA0, SA1, SA2, SA3, SA4, SA5, SA6, SA7, SA8 and SA9 and redundancy sense amplifiers RSA0 and RSA1, the technology disclosed is describing writing data to or reading data from the various columns connected (coupled) to the sense amplifiers SA0, SA1, SA2, SA3, SA4, SA5, SA6, SA7, SA8 and SA9 and redundancy sense amplifiers RSA0 and RSA1.

Additionally, FIG. 6 illustrates a cache array 512. The cache array 512 can include a first cache, which is a combination of caches CA0, CA1, CA2, CA3 and CA4, that is associated with the main division (0) 504. Being "associated" in this sense means that the first cache is designed to write to and read from sense amplifiers SA0, SA1, SA2, SA3 and SA4 of the main division (0) 504. Additional components can be located between the first cache and the corresponding main division (0) 504. The cache array 512 can also include a first redundant cache RC0 that is "local" to the first cache. The first redundant cache RC0 can be associated with the redundancy sense amplifier RSA0 of the redundancy division (0) 506.

The cache array 512 can also include a second cache, which is a combination of caches CA5, CA6, CA7, CA8 and CA9, that is associated with the main division (1) 510. Being "associated" in this sense means that the second cache is designed to write to and read from sense amplifiers SA5, SA6, SA7, SA8 and SA9 of the main division (1) 510. Additional components can be located between the second cache and the corresponding main division (1) 510. The cache array 512 can also include a second redundant cache RC1 that is "local" to the second cache. The second redundant cache RC1 can be associated with the redundancy sense amplifier RSA1 of the redundancy division (1) 508.

FIG. 6 also illustrates a data input and output interface 514 that includes various data input and output lines D0, D1, D2, D3 and D4. The technology disclosed can include control circuitry, such as that illustrated in FIG. 9 and discussed in further detail below, that includes logic to execute write and read operations for transferring data into the memory array and for transferring data out of the memory array using the data input and output lines D0, D1, D2, D3 and D4.

Specifically, FIG. 6 illustrates a page-read phase 602 of reading data from page (0) 502 of the memory array to the cache array 512 and a data-out phase 616 of transferring data from the cache array 512 to the data input and output interface 514.

In the example illustrated in FIG. 6, sense amplifiers SA1 and SA3 are connected (coupled) to defective columns. SA1 and SA3 are underlined and italicized in FIG. 6 to indicate that they correspond to defective columns. In addition, caches CA1 and CA3 are underlined and italicized in FIG. 6 because they correspond to sense amplifiers SA1 and SA3 and are associated with defective columns.

The hybrid redundancy scheme 600 includes transmitting data from the sense amplifiers SA0, SA2 and SA4 and the redundancy sense amplifiers RSA0 and RSA1 in the page-read phase 602. Data transfers from the "local" sense amplifiers can be performed first before the transfers from the redundancy sense amplifiers. Specifically, in operation 604, data is transferred from sense amplifier SA0 to cache CA0, in operation 606 data is transferred from sense amplifier SA2 to cache CA2 and, in operation 608, data is transferred from sense amplifier SA4 to cache CA4. Operations 604, 606, 608, 610 and 612 can be performed simultaneously. After the data is transferred to the caches CA0, CA2 and CA4 associated with the non-defective columns, and as a result of (e.g., responsive to) a determination that the "local" redundancy sense simplifier RSA0 has been utilized to repair a defective column (e.g., a column associated with sense amplifier SA1), data is transferred to redundant cache RC0 in operation 610. Further, a determination is also made as to whether a non-local redundancy sense amplifier has been utilized to repair a defective column. In other words, a determination that a global repair has been performed for a data write can be made as a result of (e.g., responsive to) a determination that, for example, redundancy sense amplifier RSA1 of non-local redundancy division (1) 508 has been utilized to repair a defective column. As a result of (e.g., responsive to) such a determination, data is transferred to redundant cache RC1, which corresponds to redundancy sense amplifier RSA1, in operation 612. After the page-read phase 602, in operation 614 the data is transferred to cache CA3 from redundant cache RC1 (e.g., a global repair is performed by transferring data from redundant cache RC1 to local cache CA3).

Next, in the data-out phase 616 data is transferred from the caches CA0, CA2, CA3 and CA4 to the data input and output interface 514 and then a local repair is performed by transmitting data from the redundant column RC0 to the data input and output interface 514. In operation 618 data is transferred from cache CA0 to D0, in operation 620 data is transferred from cache CA2 to D2, in operation 622 data is transferred from cache CA3 to D3 and in operation 624 data is transferred from cache CA4 to D4. In the data-out phase 616, data output is sequential (e.g., operation 618 is performed, then operation 626 is performed, then operation 620 is performed, then operation 622 is performed and then operation 624 is performed). As illustrated in FIG. 6, data is first transferred from each of the non-redundant caches that were utilized in the page-read phase 602 (i.e., caches CA0, CA2, CA3 and CA4) to the data input and output interface 514. Further, data is transferred from a local redundant cache to the data input and output interface 514. Specifically, in operation 626 a local repair is performed by transferring from local redundant cache RC0 to D1, which is associated with cache CA1 that corresponds to sense amplifier SA1 associated with a defective column. This repair using the "local" cache can increase the overall speed of the redundancy scheme.

Figure 7:
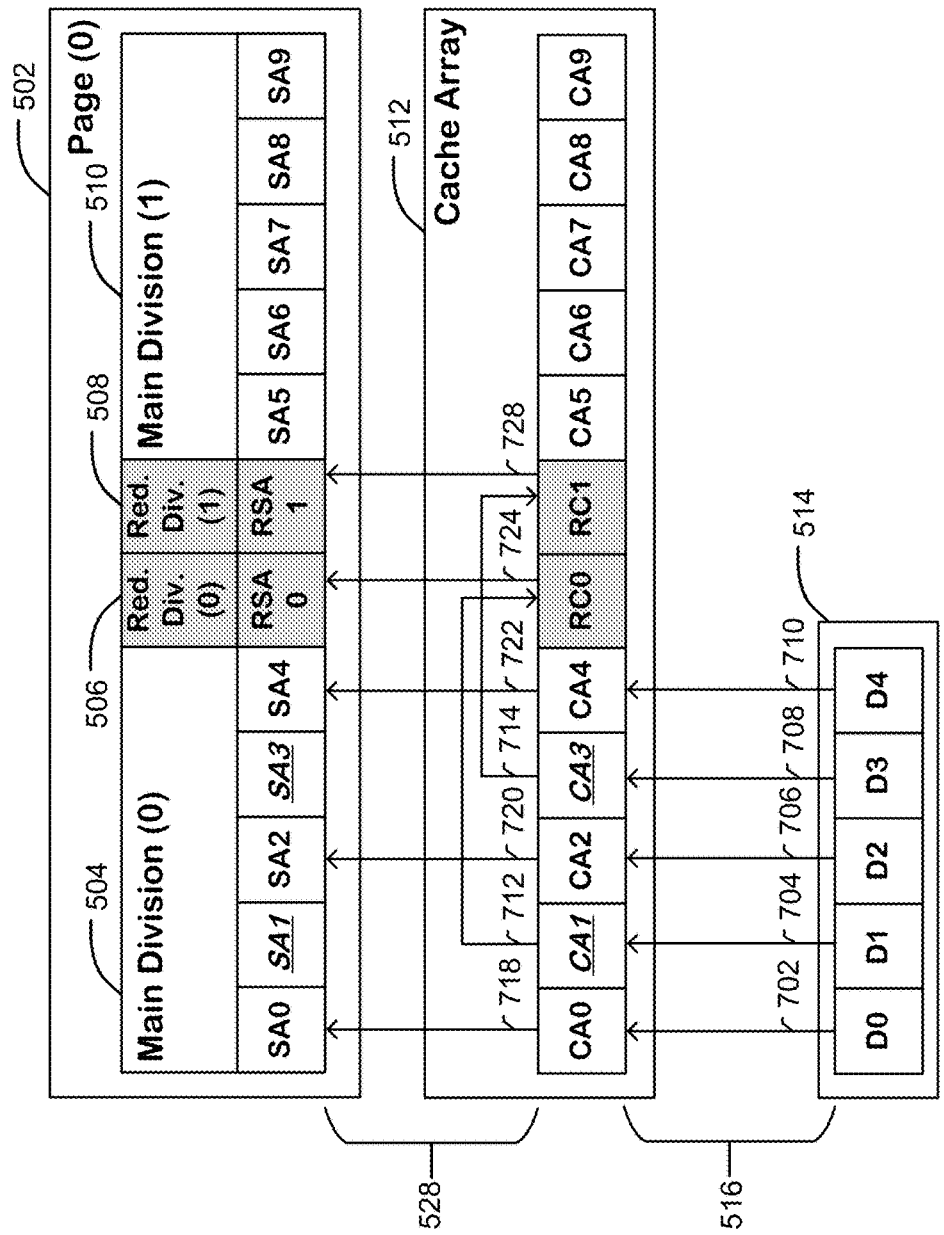
FIG. 7 illustrates a local redundancy scheme for performing write operations.

FIG. 7 illustrates a local redundancy scheme 700 for performing write operations.

Similar to FIGS. 5 and 6, FIG. 7 illustrates that a memory array includes a main division (0) 504 (e.g., a first array of storage), a redundancy division (0) 506 (e.g., a first redundant array of storage), a redundancy division (1) 508 (e.g., a second redundant array of storage) and main division (1) 510 (e.g., a second array of storage). The locations of the main division (0) 504, the redundancy division (0) 506, the redundancy division (1) 508 and the main division (1) 510 are for illustrative purposes only. These locations can be configured differently, such as that illustrated in FIG. 3 or in some other configuration. FIG. 7 illustrates that the main division (0) 504 includes sense amplifiers SAO, SAI, SA2, SA3 and SA4, that the redundancy division (0) 506 includes redundancy sense amplifier RSAO, that redundancy division (1) 508 includes redundancy sense amplifier RSAI and that main division (1) 510 includes sense amplifiers SAS, SA6, SA7, SA8 and SA9. Redundancy division (0) 506 can be considered as being "local" to main division (0) 504 and redundancy division (1) 508 can be considered as being "local" to main division (1) 510. In the same regard, redundancy division (1) 508 can be considered "global" with respect to main division (0) 504 and redundancy division (0) 506 can be considered "global" with respect to main division (1) 510.

Sense amplifiers SA0, SA1, SA2, SA3, SA4, SA5, SA6, SA7, SA8 and SA9 and redundancy sense amplifiers RSA0 and RSA1 can represent different columns of memory that are part of the main division (0) 504, the redundancy division (0) 506, the redundancy division (1) 508 and the main division (1) 510. For the sake of simplicity, as discussed below, when referring to writing data to or reading data from sense amplifiers sense amplifiers SA0, SA1, SA2, SA3, SA4, SA5, SA6, SA7, SA8 and SA9 and redundancy sense amplifiers RSA0 and RSA1, the technology disclosed is describing writing data to or reading data from the various columns connected (coupled) to the sense amplifiers SA0, SA1, SA2, SA3, SA4, SA5, SA6, SA7, SA8 and SA9 and redundancy sense amplifiers RSA0 and RSA1.

Additionally, FIG. 7 illustrates a cache array 512. The cache array 512 can include a first cache, which is a combination of caches CA0, CA1, CA2, CA3 and CA4, that is associated with the main division (0) 504. Being "associated" in this sense means that the first cache is designed to write to and read from sense amplifiers SA0, SA1, SA2, SA3 and SA4 of the main division (0) 504. Additional components can be located between the first cache and the corresponding main division (0) 504. The cache array 512 can also include a first redundant cache RC0 that is "local" to the first cache. The first redundant cache RC0 can be associated with the redundancy sense amplifier RSA0 of the redundancy division (0) 506.

The cache array 512 can also include a second cache, which is a combination of caches CA5, CA6, CA7, CA8 and CA9, that is associated with the main division (1) 510. Being "associated" in this sense means that the second cache is designed to write to and read from sense amplifiers SA5, SA6, SA7, SA8 and SA9 of the main division (1) 510. Additional components can be located between the second cache and the corresponding main division (1) 510. The cache array 512 can also include a second redundant cache RC1 that is "local" to the second cache. The second redundant cache RC1 can be associated with the redundancy sense amplifier RSA1 of the redundancy division (1) 508.

FIG. 7 also illustrates a data input and output interface 514 that includes various data-input and output lines D0, D1, D2, D3 and D4. The technology disclosed can include control circuitry, such as that illustrated in FIG. 9 and discussed in further detail below, that includes logic to execute write and read operations for transferring data into the memory array and for transferring data-out of the memory array using the data-input and output lines D0, D1, D2, D3 and D4.

Specifically, FIG. 7 illustrates a data-in phase 516 of transferring data from the data input and output interface 514 to the cache array 512 and a page-write phase 528 of transferring data from the cache array 512 to page (0) 502 of the memory array.

In the example illustrated in FIG. 7, sense amplifiers SA1 and SA3 are connected (coupled) to defective columns. SA1 and SA3 are underlined and italicized in FIG. 7 to indicate that they correspond to defective columns. In addition caches CA1 and CA3 are underlined and italicized because they correspond to SA1 and SA3 and are associated with defective columns.

As illustrated in FIG. 7, since the column associated with sense amplifier SA0 is not defective, in operation 702, data is written from D0 to CA0. The local redundancy scheme 700 also includes identifying the existence of a defective column associated with SA1 and CA1 and determining whether the redundancy division (0) 506 (e.g., the first redundant array of storage) is available for redundancy repair (e.g., determining whether there is room in a column associated with redundancy sense amplifier RSA0). A difference between the hybrid redundancy scheme 500 and the local redundancy scheme 700 is that in the local redundancy scheme 700 the local caches CA0, CA1, CA2, CA3 and CA4 will be utilized during the data-in phase 516, as opposed to using the redundancy cache RC0 in the data-in phase 516, which is done by the hybrid redundancy scheme 500 discussed above with respect to FIG. 5. In operation 704 data is transferred from D1 to corresponding cache CA1, in operation 706 data is transferred from D2 to corresponding cache CA2, in operation 708 data is transferred from D3 to corresponding cache CA3 and in operation 710 data is transferred from D4 to corresponding cache CA4. Operations 702, 704, 706, 708 and 710 are performed in sequential order.

After the data-in phase 516, local and global repairs can be performed prior to performing page-write operations. The total repair time can be (M/N+number of global repairs)× TIME. A determination can be made as to whether the first redundant array of storage (e.g., redundancy division (0) 506) is fully utilized. If the first redundant array of storage is not fully utilized, then during the page-write phase 528 (but prior to any page-write operations) a local defect repair can be performed by operation 712. In other words, if local redundant cache RC0 is not fully utilized (e.g., available for use), then during the page-write phase 528. Operation 712 transmits data from CA1, which is associated with a defective column, to redundant cache RC0 (e.g., data that is addressed to the defective column in the first array is transferred to the first redundant cache RC0).

As a result of (e.g., responsive to) a determination that the redundant cache RC0 is fully utilized (e.g., there is no more room in RC0 to provide redundancy for another defective column), a global repair can be performed in operation 714. Specifically, in operation 714 (in view of the determination that the RC0 is fully utilized), data is transmitted from cache CA3 to redundant cache RC1, which corresponds to redundancy division (1) 508.

After the local and global repairs are performed in the page-write phase 528, actual page writing operations can be performed. Specifically, during the page-write phase 528, in operation 718 data is transmitted from cache CA0 to corresponding sense amplifier SA0 and eventually to the corresponding column, in operation 720 data is transmitted from cache CA2 to corresponding sense amplifier SA2 and eventually to the corresponding column, and in operation 722 data is transmitted from cache CA4 to corresponding sense amplifier SA4 and eventually to the corresponding column. In operation 724 the repair for sense amplifier SA1 that corresponds to a defective column is performed by transmitting data from "local" redundant cache RC0 to the local redundancy sense amplifier RSA0. In operation 728 the repair for sense amplifier SA3 that corresponds to a defective column is performed by transmitting data from non-local redundant cache RC1 to non-local redundant sense amplifier RSA1 of redundancy division (1) 508. Operations 718, 720, 722, 724 and 728 can be performed simultaneously.

As illustrated in FIG. 7, the local redundancy scheme utilizes caches CA0, CA1, CA2, CA3 and CA4 in the data-in phase 516, regardless of whether or not any of caches CA0, CA1, CA2, CA3 and CA4 corresponds to a defective column. Here, because caches CA1 and CA3 correspond to defective columns, during the page-write phase 528 (but before page-write operations are performed) local and global repairs can be performed by transmitting data to redundancy columns RC0 and RC1. In contrast, and as discussed above with respect to FIG. 5, in the hybrid redundancy scheme, rather than using each of caches CA0, CA1, CA2, CA3 and CA4 in the data-in phase 516 as illustrated in FIG. 7, redundant cache RC0 is utilized in operation 520 to perform all of the local repairs. However, because RC0 becomes fully utilized in operation 520, operation 524 transmits data to cache CA3 and operation 530 transmits data from cache CA3 to redundant cache RC1 to perform the global repairs after the data-in phase 516, but prior to performing page-write operations.

Figure 8:
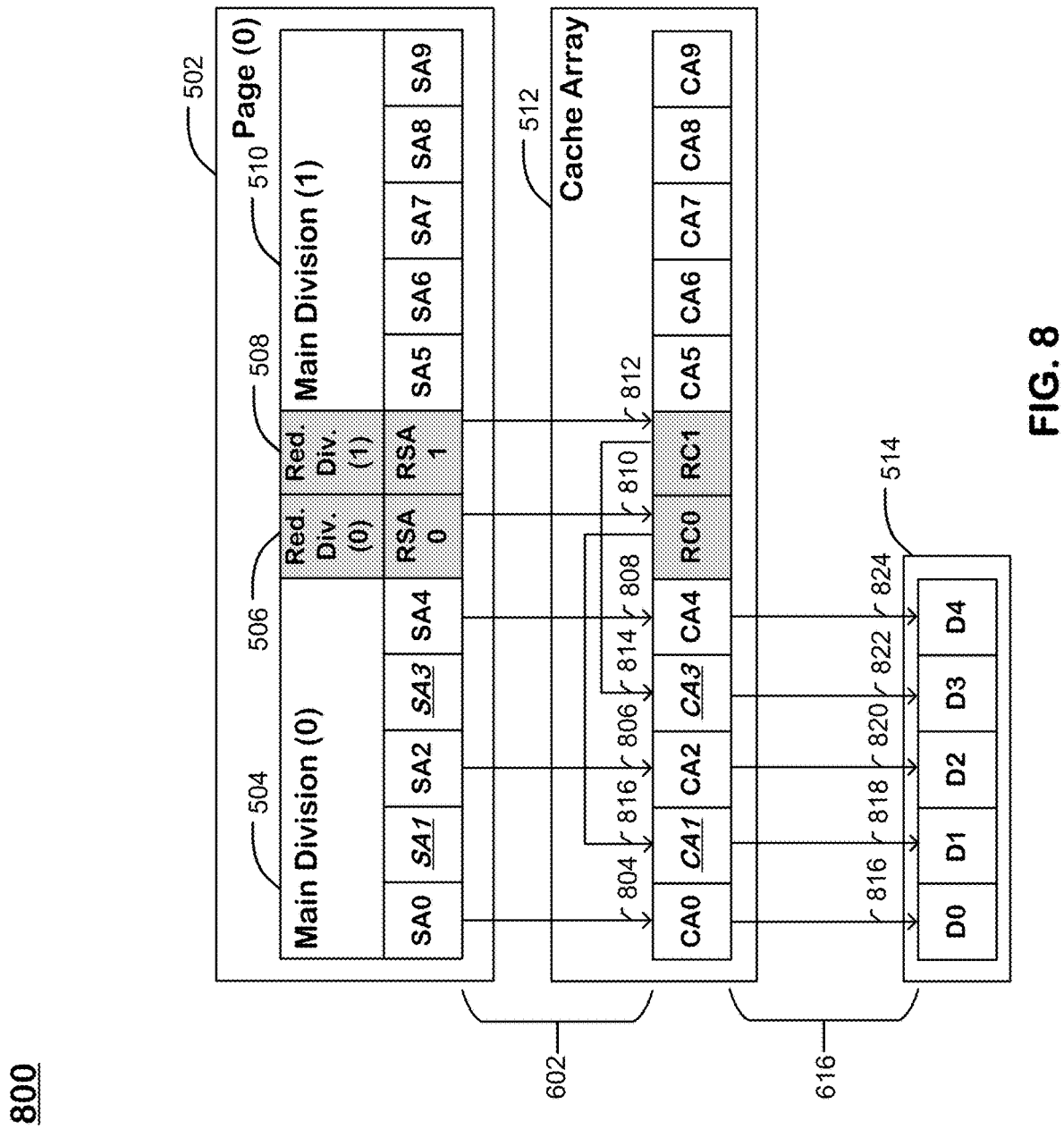
FIG. 8 illustrates a local redundancy scheme for performing read operations.

FIG. 8 illustrates a local redundancy scheme 800 for performing read operations.

Similar to FIGS. 5-7, FIG. 8 illustrates that a memory array includes a main division (0) 504 (e.g., a first array of storage), a redundancy division (0) 506 (e.g., a first redundant array of storage), a redundancy division (1) 508 (e.g., a second redundant array of storage) and main division (1) 510 (e.g., a second array of storage). The locations of the main division (0) 504, the redundancy division (0) 506, the redundancy division (1) 508 and the main division (1) 510 are for illustrative purposes only. These locations can be configured differently, such as that illustrated in FIG. 3 or in some other configuration. FIG. 6 illustrates that the main division (0) 504 includes sense amplifiers SA0, SA1, SA2, SA3 and SA4, that the redundancy division (0) 506 includes redundancy sense amplifier RSA0, that redundancy division (1) 508 includes redundancy sense amplifier RSA1 and that main division (1) 510 includes sense amplifiers SA5, SA6, SA7, SA8 and SA9. Redundancy division (0) 506 can be considered as being "local" to main division (0) 504 and redundancy division (1) 508 can be considered as being "local" to main division (1) 510. In the same regard, redundancy division (1) 508 can be considered "global" with respect to main division (0) 504 and redundancy division (0) 506 can be considered "global" with respect to main division (1) 510.

Sense amplifiers SA0, SA1, SA2, SA3, SA4, SA5, SA6, SA7, SA8 and SA9 and redundancy sense amplifiers RSA0 and RSA1 can represent different columns of memory that are part of the main division (0) 504, the redundancy division (0) 506, the redundancy division (1) 508 and the main division (1) 510. For the sake of simplicity, as discussed below, when referring to writing data to or reading data from sense amplifiers sense amplifiers SA0, SA1, SA2, SA3, SA4, SA5, SA6, SA7, SA8 and SA9 and redundancy sense amplifiers RSA0 and RSA1, the technology disclosed is describing writing data to or reading data from the various columns connected (coupled) to the sense amplifiers SA0, SA1, SA2, SA3, SA4, SA5, SA6, SA7, SA8 and SA9 and redundancy sense amplifiers RSA0 and RSA1.

Additionally, FIG. 8 illustrates a cache array 512. The cache array 512 can include a first cache, which is a combination of caches CA0, CA1, CA2, CA3 and CA4, that is associated with the main division (0) 504. Being "associated" in this sense means that the first cache is designed to write to and read from sense amplifiers SA0, SA1, SA2, SA3 and SA4 of the main division (0) 504. Additional components can be located between the first cache and the corresponding main division (0) 504. The cache array 512 can also include a first redundant cache RC0 that is "local" to the first cache. The first redundant cache RC0 can be associated with the redundancy sense amplifier RSA0 of the redundancy division (0) 506.

The cache array 512 can also include a second cache, which is a combination of caches CA5, CA6, CA7, CA8 and CA9, that is associated with the main division (1) 510. Being "associated" in this sense means that the second cache is designed to write to and read from sense amplifiers SA5, SA6, SA7, SA8 and SA9 of the main division (1) 510. Additional components can be located between the second cache and the corresponding main division (1) 510. The cache array 512 can also include a second redundant cache RC1 that is "local" to the second cache. The second redundant cache RC1 can be associated with the redundancy sense amplifier RSA1 of the redundancy division (1) 508.

FIG. 8 also illustrates a data input and output interface 514 that includes various data-input and output lines D0, D1, D2, D3 and D4. The technology disclosed can include control circuitry, such as that illustrated in FIG. 9 and discussed in further detail below, that includes logic to execute write and read operations for transferring data into the memory array and for transferring data-out of the memory array using the data-input and output lines D0, D1, D2, D3 and D4.

Specifically, FIG. 8 illustrates a page-read phase 602 of reading data from page (0) 502 of the memory array to the cache array 512 and a data-out phase 616 of transferring data from the cache array 512 to the data input and output interface 514.

In the example illustrated in FIG. 8, sense amplifiers SA1 and SA3 are connected (coupled) to defective columns. SA1 and SA3 are underlined and italicized in FIG. 8 to indicate that they correspond to defective columns. In addition caches CA1 and CA3 are underlined and italicized in FIG. 8 because they correspond to sense amplifiers SA1 and SA3 and are associated with defective columns.

The local redundancy scheme 800 includes transmitting data from the sense amplifiers SA0, SA2 and SA4 and the redundancy sense amplifiers RSA0 and RSA1 in the page-read phase 602. Data transfers from the "local" sense amplifiers can be performed first, then data is transferred from the "local" redundancy sense amplifier and then data is transferred from the non-local sense amplifier. Data transfers in the page-read phase 602 can be simultaneous. Specifically, in operation 804 data is transferred from sense amplifier SA0 to cache CA0, in operation 806 data is transferred from sense amplifier SA2 to cache CA2 and in operation 808 data is transferred from sense amplifier SA4 to cache CA4. After the data is transferred to the caches CA0, CA2 and CA4 associated with the non-defective columns, then global repairs are performed followed by local repairs. A determination can be made as to whether "local" redundancy sense amplifier RSA0 has been utilized to repair a defective column (e.g., a column associated with sense amplifier SA1) and a determination can be made as to whether global (non-local) redundancy sense amplifier RSA1 has been utilized. As a result of (e.g., responsive to) a determination that redundancy sense amplifier RSA0 of "local" redundancy division (0) 506 has been utilized to repair a defective column, data is transferred from redundancy sense amplifier RSA0 to redundant cache RC0 in operation 810. As mentioned above, a determination can be made as to whether a non-local redundancy sense amplifier has been utilized to repair a defective column. As a result of (e.g., responsive to) a determination that, for example, redundancy sense amplifier RSA1 of non-local redundancy division (1) 508 has been utilized to repair a defective column, data is transferred to redundant cache RC1, which corresponds to redundancy sense amplifier RSA1, in operation 812. Operations 804, 806, 808, 810 and 812 can be performed simultaneously.

After the page-read phase 602 data is transferred from any local and non-local redundant caches to appropriate caches of the first array. Specifically, in operation 814 a global repair is performed by transferring data from non-local redundant cache RC1 to cache CA3. In operation 816 a local repair is performed by transferring data from local redundant cache RC0 to CA1. This repair using the "local" cache increases the overall speed of the redundancy scheme. For example, the total repair time will be (M/N+number of global repairs)×TIME.

Now that caches CA0, CA1, CA2, CA3 and CA4 have all received data-in operations 804, 806, 808, 814 and 816, data is transferred from caches CA0, CA1, CA2, CA3 and CA4 to the data input and output interface 514 in the data-out phase 616. Specifically, in the data-out phase 616 data is transferred from the caches CA0, CA1, CA2, CA3 and CA4 to the corresponding data-input and output lines of the data input and output interface 514. In operation 816 data is transferred from cache CA0 to D0, in operation 818 data is transferred from cache CA1 to D1, in operation 820 data is transferred from cache CA2 to D2, in operation 822 data is transferred from CA3 to D3 and in operation 824 data is transferred from cache CA4 to D4. Operations 816, 818, 820, 822 and 824 are performed in sequential order.

As illustrated in FIG. 8, a difference between the hybrid redundancy scheme 600 of FIG. 6 and the local redundancy scheme 800 is that during the page-read phase 602 of FIG. 8 data is transferred to each cache CA0, CA1, CA2, CA3 and CA4, but during the page-read phase 602 of FIG. 6 data is only transferred to caches CA0, CA2, CA3 and CA4. As a result, during the data-out phase 616 of FIG. 8, each of caches CA0, CA1, CA2, CA3 and CA4 is utilized to transfer data to the data input and output interface 514, whereas during the data-out phase 616 of FIG. 6, caches CA0, CA2, CA3 and CA4 and redundant cache RC0 are utilized to transfer data to the data input and output interface 514. Regarding which operations can be performed simultaneously and which operations can be performed sequentially, it is noted that operations that are part of the data-in phase 516 and the data-out phase 616 can be performed sequentially and the read/write operations that are part of the page-write phase 528 and the page-read phase 602 can be performed simultaneously.

Figure 9:
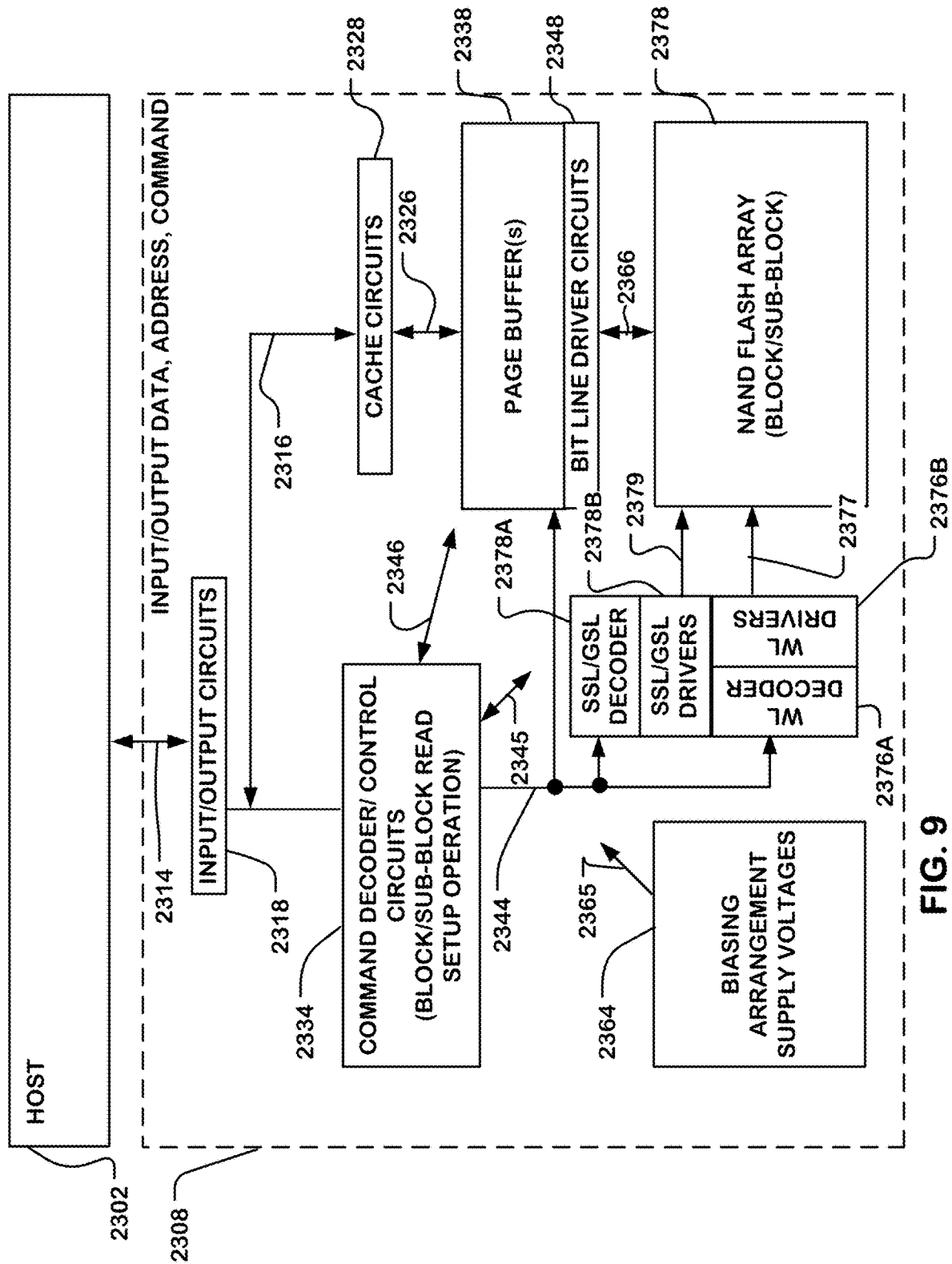
FIG. 9 is a simplified diagram of a memory system that can be used to implement the various redundancy schemes described herein.

FIG. 9 is a simplified diagram of a memory system that can be used to implement the various redundancy schemes described herein. The memory system can include a memory device 2308 implemented on an integrated circuit and a host 2302 including logic for issuing commands such as read commands, and program commands with addresses and data to be programmed. The flash memory device 2308 can be replaced by other types of memory devices, as FIG. 9 is merely an example of a type of memory system that can be used to implement the various types of column defect repairs describe herein. The memory device 2308 can be implemented on a single integrated circuit chip, on a multichip module, or on a plurality of chips configured as suits a particular need.

The memory device 2308 in this example includes a memory array 2378 including a plurality of blocks as described above, each having a plurality of sub-blocks, on an integrated circuit substrate. The memory array 2378 can be a NAND flash memory implemented using two-dimensional or three-dimensional array technology.

In various embodiments, the memory device 2308 may have single-level cells (SLC), or multiple-level cells storing more than one bit per cell (e.g., multi-level cell (MLC) technology, triple-level cell (TLC) technology or quad-level cell (QLC) technology, etc.).

The memory device 2308 includes a memory array 2378, which can be a NAND flash memory implemented using three-dimensional array technology having one or multiple planes, each plane having multiple blocks, and each block having multiple sub-blocks.

A word line decoder 2376A is coupled via word line driver circuits 2376B to a plurality of word lines 2377 in the memory array 2378. SSL/GSL decoder 2378A is coupled via SSL/GSL driver circuits 2378B by SSL and GSL lines 2379, to bit line side (SSL) and common source side (GSL) string select gates in the array. Page buffer circuits 2338 are coupled by bit line driver circuits 2348 to bit lines 2366 in the memory array 2378. In some embodiments, column decoder circuits can be included for routing data from the bit line drivers to selected bit lines. The page buffer circuits 2338 can store pages of data that define a data pattern for a page program operation, and can include sensing circuits used in read and verify operations.

Bit lines for memory arrays can comprise global bit lines (GBL) and local bit lines. Bit lines generally comprise metal conductors in higher patterned layers that traverse a plurality of blocks of memory cells in an array. The global bit lines are connected (coupled) to the NAND strings for current flow to and from the bit lines, which in turn are connected (coupled) to the bit line driver circuits 2348 and page buffer circuits 2338. Likewise, the word lines can include global word lines and local word lines with corresponding supporting circuits 2376B in the word line drivers.

In a sensing operation, sensed data from the page buffer circuits 2338 are supplied via second data lines in bus system 2326 to cache circuits 2328, which are in turn coupled to input/output circuits 2318 via data path links 2316. Also, input data is applied in this example to the cache circuits 2328 on links 2316, and to the page buffer circuits 2338 on bus system 2326, for use in support of program operations. Additionally, the memory array 2378 can store defect information regarding defective columns and address mapping information that can be used to point data to repair addresses as opposed to defective addresses.

Input/output circuits 2318 are connected (coupled) by link 2314 (including I/O pads) and provide communication paths for the data, addresses and commands with destinations external to the memory device 2308, including the host 2302 in this example. The input/output circuits 2318 provide a communication path by link 2316 to cache circuits 2328 which support memory operations. The cache circuits 2328 are in data flow communication (using for example a bus system 2326) with page buffer circuits 2338.

Control circuits 2334 are connected (coupled) to the input/output circuits 2318, and include command decoder logic, address counters, state machines, timing circuits and other logic circuits that control various memory operations, including program, read, and erase operations for the memory array 2378 as well as operations related to the hybrid and local redundancy schemes described herein. Control circuit signals are distributed to circuits in the memory device, as shown by arrows 2345, 2346, as required to support the operations of the circuits. The control circuits 2334 can include address registers and the like for delivery of addresses as necessary to the components of the memory device 2308, including delivery to the cache circuits 2328 and, on link 2344, to the page buffer circuits 2338, word line decoder 2376A and SSL/GSL decoder 2378A in this illustration.

In the example shown in FIG. 9, control circuits 2334 include control logic circuits that include modules implementing a bias arrangement state machine, or machines, which controls, or control, the application of bias voltages generated or provided through the voltage supply or supplies in block 2364, including read, erase, verify and program voltages including precharge voltages, pass voltages and other bias voltages as described herein to word line driver circuits 2376B and bit line driver circuits 2348, for a set of selectable program, read and read operations. Bias voltages are applied as represented by arrow 2365, to components of the memory device 2308, as necessary for support of the operations.

The control circuits 2334 can include modules implemented using special-purpose logic circuitry including state machines, as known in the art. In alternative embodiments, the control circuits 2334 can include modules implemented using a general-purpose processor, which can be implemented on the same integrated circuit, which execute a computer program to control the operations of the memory device 2308. In yet other embodiments, a combination of special-purpose logic circuitry and a general-purpose processor can be utilized for implementation of modules in control circuits 2334.

The flash memory array 2378 can comprise floating gate memory cells or dielectric charge trapping memory cells configured to store multiple bits per cell, by the establishment of multiple program levels that correspond to amounts of charge stored, which in turn establish memory cell threshold voltages Vt. The technology can be used with single-bit-per-cell flash memory, and with other multiple-bit-per-cell and single-bit-per-cell memory technologies. In other examples, the memory cells may comprise programmable resistance memory cells, phase change memory cells, and other types of non-volatile and volatile memory cell technologies.

In the illustrated example, the host 2302 is coupled to links 2314 on the memory device 2308, as well as other control terminals not shown, such as chip select terminals and so on, and can provide commands or instructions to the memory device 2308. In some examples, the host 2302 can be coupled to the memory device using a serial bus technology, using shared address and data lines. The host 2302 can comprise a general purpose processor, a special purpose processor, a processor configured as a memory controller, or other processor that uses the memory device 2308. All or part of the host 2302 can be implemented on the same integrated circuit as the memory. The memory controller can execute some or all of the processes described with reference to FIGS. 5-8.

The host 2302 can update data stored in the memory based on requests from an application program. In general, the host 2302 can include programs that perform memory management functions. Also, the host 2302 can include application programs, file systems, flash translation layer programs and other components that can produce status information for data stored in the memory, including issuing commands to program data having addresses and data to be programmed.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising:
   a memory array including a first array of storage, a first redundant array of storage that is local to the first array of storage, a second array of storage, and a second redundant array of storage that is local to the second array;
   a cache array including a first cache associated with the first array of storage, a first redundant cache that is local to the first cache, a second cache associated with the second array of storage, and a second redundant cache that is local to the second cache; and
   control circuits comprising logic to execute operations for transferring data into the memory array, the operations comprising:
      responsive to an identification of a defective column in the first array of storage, performing a local defect write repair by transferring data into the first redundant array of storage through one of the first cache and the first redundant cache; and
      responsive to an identification of another defective column in the first array of storage and a determination that the first redundant array of storage is fully utilized, performing a global defect write repair by transferring data into the second redundant array of storage through the first cache and the second redundant cache.

2. The memory device of claim 1, wherein the local defect write repair comprises, responsive to a determination that the first redundant array of storage is not fully utilized and responsive to an identification of yet another defective column in the first array of storage:
   in a data-in phase, transferring data addressed to the defective column in the first array of storage and data addressed to the yet another defective column in the first array of storage to the first redundant cache; and
   in a page-write phase, transferring the data addressed to the defective column in the first array of storage and the data addressed to the yet another defective column in the first array of storage from the first redundant cache to the first redundant array of storage that is local to the first cache.

3. The memory device of claim 1, wherein the local defect write repair comprises, responsive to a determination that the first redundant array of storage is not fully utilized:
   in a data-in phase, transferring data addressed to the defective column in the first array of storage to the first redundant cache; and
   in a page-write phase, transferring the data addressed to the defective column in the first array of storage from the first redundant cache to the first redundant array of storage that is local to the first cache.

4. The memory device of claim 3, wherein the global defect write repair comprises, responsive to the determination that the first redundant array of storage is fully utilized:
   in the data-in phase, transferring data addressed to the other defective column in the first array of storage to the first cache; and
   in the page-write phase, transferring the data addressed to the other defective column from the first cache to the second redundant cache, which is not local to the first cache, and transferring the data addressed to the other defective column from the second redundant cache to the second redundant array of storage that is local to the second array of storage and is not local to the first array of storage.

5. The memory device of claim 4, wherein the transferring of the data addressed to the defective column, as performed by the local defect write repair, is performed before the transferring of the data addressed to the other defective column, as performed by the global defect write repair.

6. The memory device of claim 5, wherein the transferring of (i) the data addressed to the defective column in the first array of storage to the first redundant cache and (ii) the data addressed to the defective column in the first array of storage from the first redundant cache to the first redundant array of storage that is local to the first cache are performed before the transferring of (i) the data addressed to the other defective column in the first array of storage to the first cache, (ii) the data addressed to the other defective column from the first cache to the second redundant cache, which is not local to the first cache, and (iii) the data addressed to the other defective column from the second redundant cache to the second redundant array of storage that is local to the second array of storage and is not local to the first array of storage.

7. The memory device of claim 1, wherein the local defect write repair comprises, responsive to a determination that the first redundant array of storage is not fully utilized:
- in a data-in phase, transferring data addressed to the defective column in the first array of storage to the first cache; and
- in a page-write phase, transferring the data addressed to the defective column in the first array of storage from the first cache to the first redundant cache that is local to the first cache and transferring the data addressed to the defective column in the first array of storage from the first redundant cache to the first redundant array of storage that is local to the first array of storage.

8. The memory device of claim 7, wherein the global defect write repair comprises, responsive to the determination that the first redundant array of storage is fully utilized:
- in the data-in phase, transferring the data addressed to the other defective column in the first array of storage to the first cache; and
- in the page-write phase, transferring the data addressed to the other defective column in the first array of storage from the first cache to the second redundant cache that is not local to the first cache and transferring the data addressed to the other defective column in the first array of storage from the second redundant cache to the second redundant array of storage that is not local to the first array of storage.

9. The memory device of claim 8, wherein the transferring of the data addressed to the defective column, as performed by the local defect write repair, is performed before the transferring of the data addressed to the other defective column, as performed by the global defect write repair.

10. A memory device, comprising:
- a memory array including a first array of storage, a first redundant array of storage of storage that is local to the first array of storage, a second array of storage, and a second redundant array of storage that is local to the second array of storage;
- a cache array including a first cache associated with the first array of storage, a first redundant cache that is local to the first cache, a second cache associated with the second array of storage, and a second redundant cache that is local to the second cache; and
- control circuits comprising logic to execute operations for transferring data from the memory array, the operations comprising, after a phase of transferring data from the first array of storage to the first cache:
  - responsive to an identification of a defective column in the first array of storage and a determination that the first redundant array of storage is fully utilized, performing a global defect read repair by transferring data from the second redundant array of storage to the second redundant cache, transferring the data from the second redundant cache to the first cache, and transferring the data from the first cache to an input and output data line; and
  - responsive to an identification of another defective column in the first array of storage, performing a local defect read repair by transferring data from the first redundant array of storage through at least one of the first redundant cache and the first cache to an input and output data line.

11. The memory device of claim 10, wherein the transferring of the data from the second redundant array of storage to the second redundant cache, the first cache and the input and output data line includes transferring the data from the second redundant array of storage to the second redundant cache, then transferring the data from the second redundant cache to the first cache, and then transferring the data from the first cache to the input and output data line.

12. The memory device of claim 10, wherein the global defect read repair comprises, responsive to the determination that the first redundant array of storage is fully utilized:
- in a page-read phase, transferring data addressed to the defective column in the first array of storage from the second redundant array of storage to the second redundant cache and transferring the data addressed to the defective column in the first array of storage from the second redundant cache to the first cache; and
- in a data-out phase, transferring the data addressed to the defective column in the first array of storage from the first cache to a data input and output line.

13. The memory device of claim 12, wherein the local defect read repair comprises:
- in the page-read phase, transferring data addressed to the other defective column in the first array of storage from the first redundant array of storage to the first redundant cache that is local to the first cache; and
- in the data-out phase, transferring the data addressed to the other defective column in the first array of storage from the first redundant cache to a data input and output line.

14. The memory device of claim 13, wherein the transferring of the data addressed to the defective column in the first array of storage from the second redundant cache to the first cache, as performed in the page-read phase of the global defect read repair, is performed before the transferring of the data addressed to the other defective column in the first array of storage from the first redundant cache to the data input and output line.

15. The memory device of claim 12, wherein the local defect read repair comprises:
- in the page-read phase, transferring data addressed to the other defective column in the first array of storage from the first redundant array of storage to the first redundant cache that is local to the first cache and transferring the data addressed to the other defective column in the first array of storage from the first redundant cache to the first cache; and
- in the data-out phase, transferring the data addressed to the other defective column in the first array of storage from the first cache to a data input and output line.

16. The memory device of claim 15, wherein the transferring of the data addressed to the defective column in the first array of storage from the second redundant cache to the first cache, as performed in the page-read phase of the global defect read repair, is performed before the transferring of the data addressed to the other defective column in the first array of storage from the first redundant cache to the first cache, as performed in the page-read phase of the local defect repair.

17. A method of writing data to a memory device having a defect,
wherein the memory device includes:
a memory array including a first array of storage, a first redundant array of storage that is local to the first array of storage, a second array of storage, and a second redundant array of storage that is local to the second array; and
a cache array including a first cache associated with the first array of storage, a first redundant cache that is local to the first cache, a second cache associated with the second array of storage, and a second redundant cache that is local to the second cache, and
wherein the method includes:
responsive to an identification of a defective column in the first array of storage, performing a local defect write repair by transferring data into the first redundant array of storage through one of the first cache and the first redundant cache, and
responsive to an identification of another defective column in the first array of storage and a determination that the first redundant array of storage is fully utilized, performing a global defect write repair by transferring data into the second redundant array of storage through the first cache and the second redundant cache.

18. The method of claim 17, wherein the transferring of the data into the second redundant array of storage through the first cache and the second redundant cache includes transferring the data to the first cache, then transferring the data from the first cache to the second redundant cache and then transferring the data from the second redundant cache to the second redundant array of storage.

19. A method of reading data from a memory device having a defect,
wherein the memory device includes:
a memory array including a first array of storage, a first redundant array of storage of storage that is local to the first array of storage, a second array of storage, and a second redundant array of storage that is local to the second array of storage; and
a cache array including a first cache associated with the first array of storage, a first redundant cache that is local to the first cache, a second cache associated with the second array of storage, and a second redundant cache that is local to the second cache, and
wherein the method includes, after a phase of transferring data from the first array of storage to the first cache:
responsive to an identification of a defective column in the first array of storage and a determination that the first redundant array of storage is fully utilized, performing a global defect read repair by transferring data from the second redundant array of storage to the second redundant cache, transferring the data from the second redundant cache to the first cache, and transferring the data from the first cache to an input and output data line, and
responsive to an identification of another defective column in the first array of storage, performing a local defect read repair by transferring data from the first redundant array of storage through at least one of the first redundant cache and the first cache to an input and output data line.

20. The method of claim 19, wherein the transferring of the data from the second redundant array of storage to the second redundant cache, the first cache and the input and output data line includes transferring the data from the second redundant array of storage to the second redundant cache, then transferring the data from the second redundant cache to the first cache, and then transferring the data from the first cache to the input and output data line.

* * * * *